US011348927B2

(12) United States Patent
Huang

(10) Patent No.: US 11,348,927 B2
(45) Date of Patent: May 31, 2022

(54) CONDUCTIVE FEATURE FORMATION

(71) Applicant: Taiwan Semiconductor Manufacturing Co., Ltd., Hsinchu (TW)

(72) Inventor: Yu-Lien Huang, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 58 days.

(21) Appl. No.: 17/062,848

(22) Filed: Oct. 5, 2020

(65) Prior Publication Data

US 2021/0020642 A1 Jan. 21, 2021

Related U.S. Application Data

(62) Division of application No. 16/145,432, filed on Sep. 28, 2018, now Pat. No. 10,797,058.

(51) Int. Cl.
*H01L 27/11* (2006.01)
*H01L 21/8234* (2006.01)
(Continued)

(52) U.S. Cl.
CPC ...... *H01L 27/1104* (2013.01); *H01L 21/0332* (2013.01); *H01L 21/32137* (2013.01);
(Continued)

(58) Field of Classification Search
CPC . H01L 29/66795; H01L 29/785; H01L 27/11; H01L 23/5386; H01L 23/485; G11C 5/14
See application file for complete search history.

(56) References Cited

U.S. PATENT DOCUMENTS 5,705,443 A 1/1998 Stauf et al.
9,496,269 B1 11/2016 Liaw
(Continued)

FOREIGN PATENT DOCUMENTS

KR 20110087976 A 8/2011
KR 20170051225 A 5/2017
(Continued)

*Primary Examiner* — Allen L Parker
*Assistant Examiner* — Wasiul Haider
(74) *Attorney, Agent, or Firm* — Slater Matsil LLP

(57) ABSTRACT

The present disclosure provides example embodiments relating to conductive features, and methods of forming the conductive features, that have differing dimensions. In an embodiment, a structure includes a substrate, a dielectric layer over the substrate, and first and second conductive features through the dielectric layer to first and second source/drain regions, respectively, on the substrate. The first conductive feature has a first length along a longitudinal axis of the first conductive feature and a first width perpendicular to the first length. The second conductive feature has a second length along a longitudinal axis of the second conductive feature and a second width perpendicular to the second length. The longitudinal axis of the first conductive feature is aligned with the longitudinal axis of the second conductive feature. The first width is greater than the second width, and the first length is less than the second length.

20 Claims, 31 Drawing Sheets

(51) Int. Cl.
   *H01L 21/3213*   (2006.01)
   *H01L 27/088*    (2006.01)
   *H01L 29/66*     (2006.01)
   *H01L 29/78*     (2006.01)
   *H01L 21/033*    (2006.01)

(52) U.S. Cl.
   CPC .......... *H01L 21/32139* (2013.01); *H01L 21/823431* (2013.01); *H01L 27/0886* (2013.01); *H01L 27/1116* (2013.01); *H01L 29/66545* (2013.01); *H01L 29/66795* (2013.01); *H01L 29/785* (2013.01)

(56)   References Cited

U.S. PATENT DOCUMENTS

| | | |
|---|---|---|
| 2003/0168992 A1 | 9/2003 | Noguchi et al. |
| 2007/0205414 A1 | 9/2007 | Chang et al. |
| 2007/0243671 A1 | 10/2007 | Aw |
| 2007/0249174 A1 | 10/2007 | Yang |
| 2011/0183505 A1 | 7/2011 | Min et al. |
| 2015/0170959 A1 | 6/2015 | Huang et al. |
| 2016/0284600 A1 | 9/2016 | Liaw et al. |
| 2019/0067455 A1* | 2/2019 | Cho ............ H01L 21/02598 |
| 2019/0109197 A1 | 4/2019 | Wang et al. |

FOREIGN PATENT DOCUMENTS

| | | |
|---|---|---|
| TW | I626728 B | 6/2018 |
| WO | 2015112163 A1 | 7/2015 |

* cited by examiner

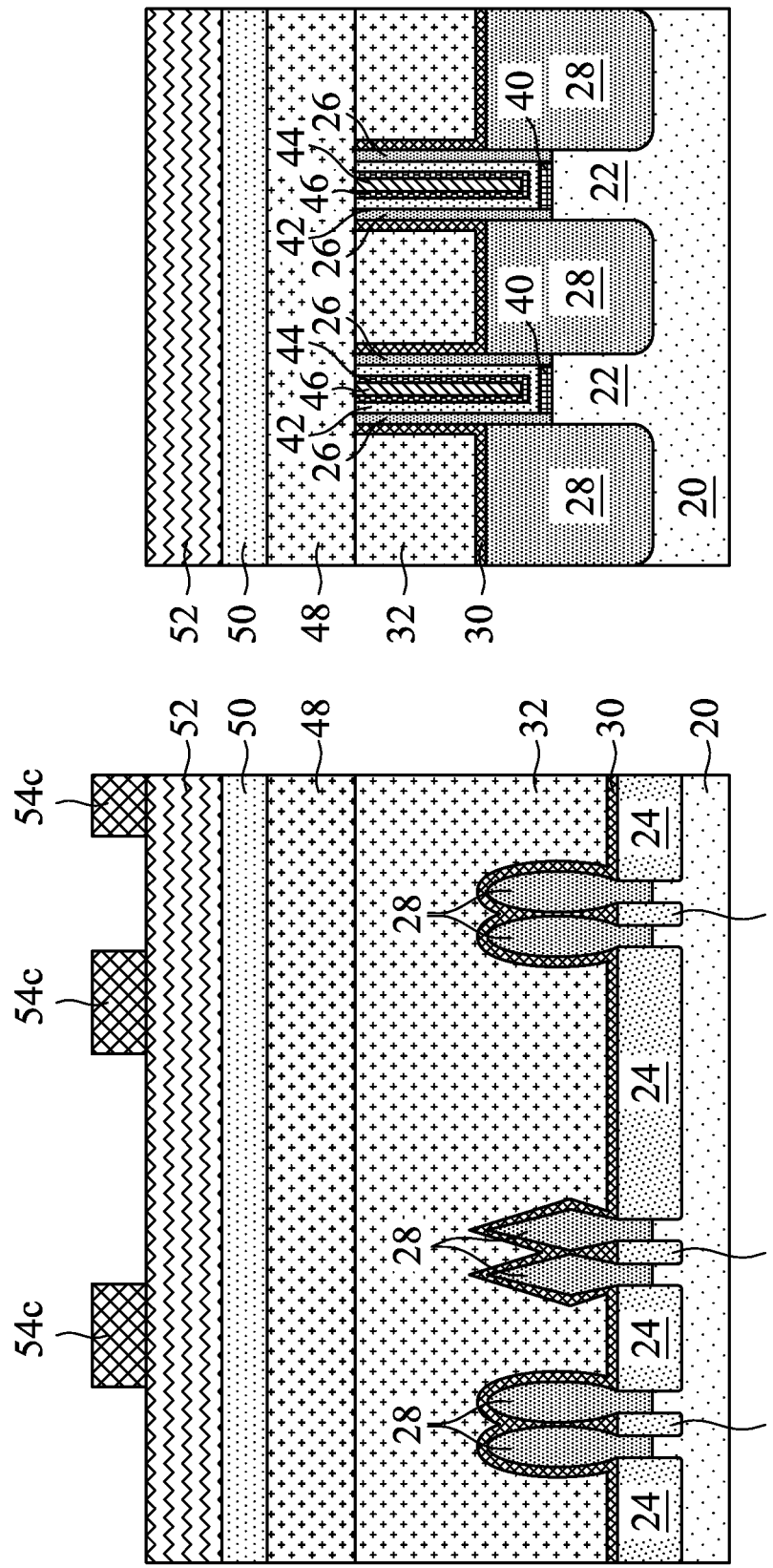

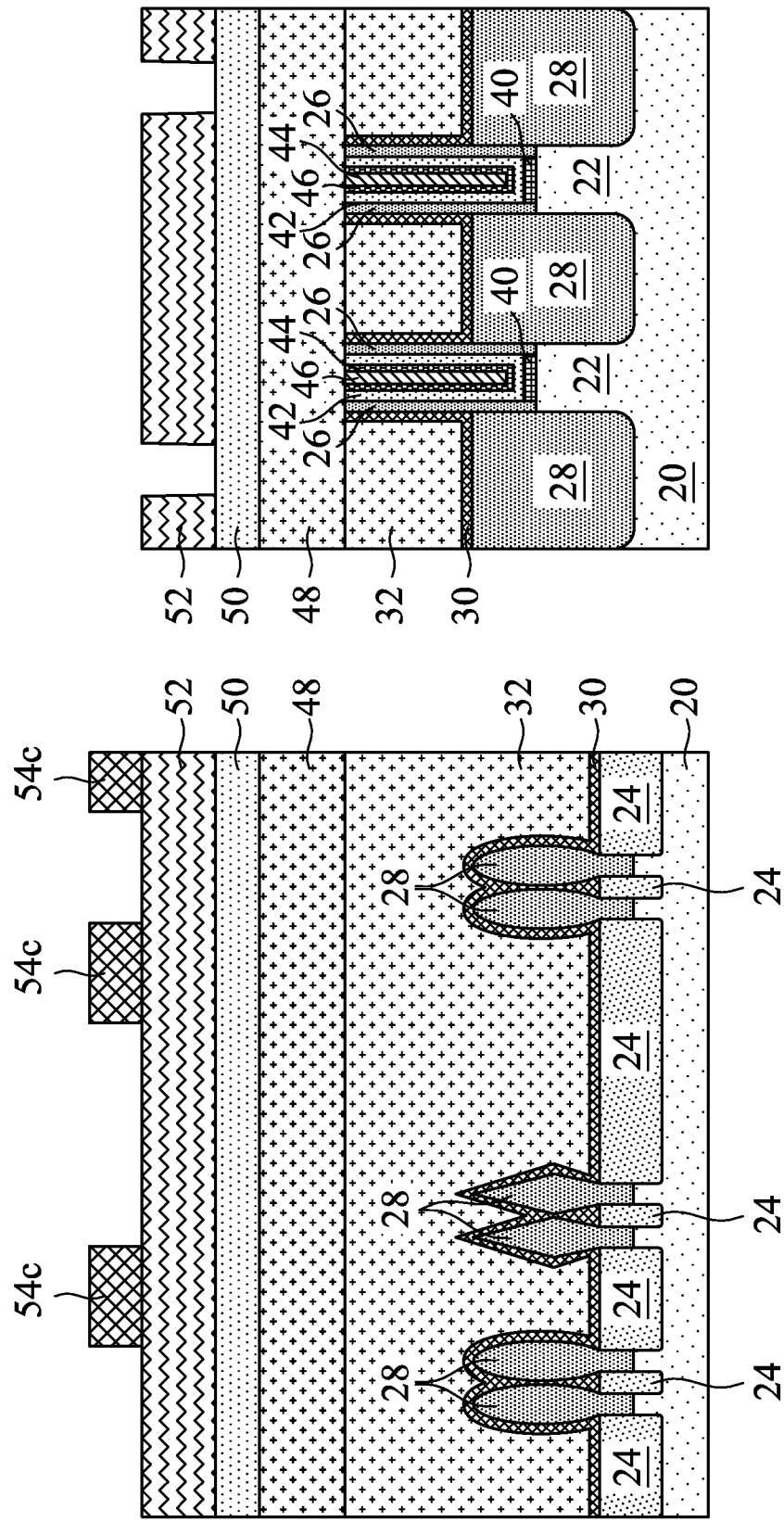

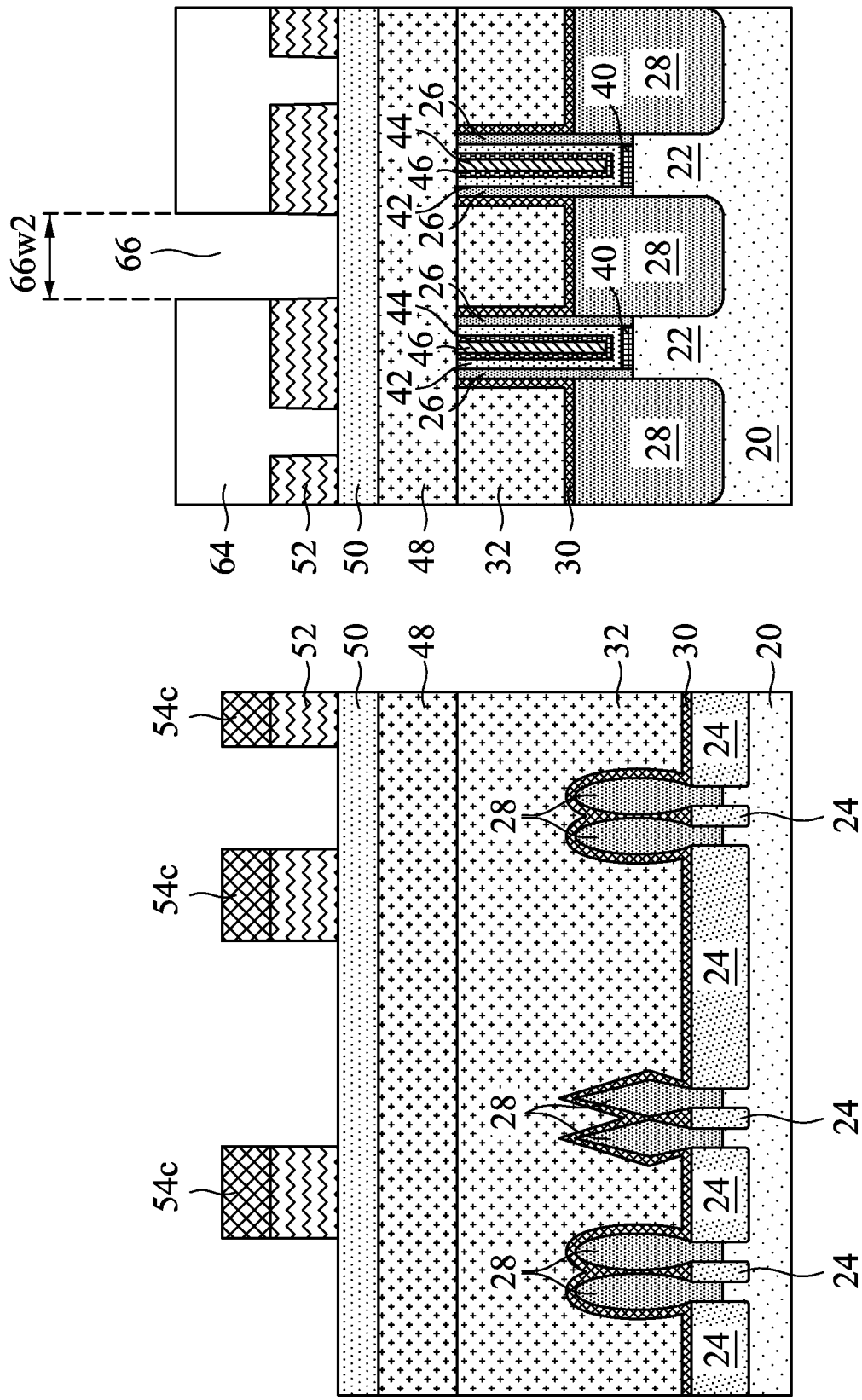

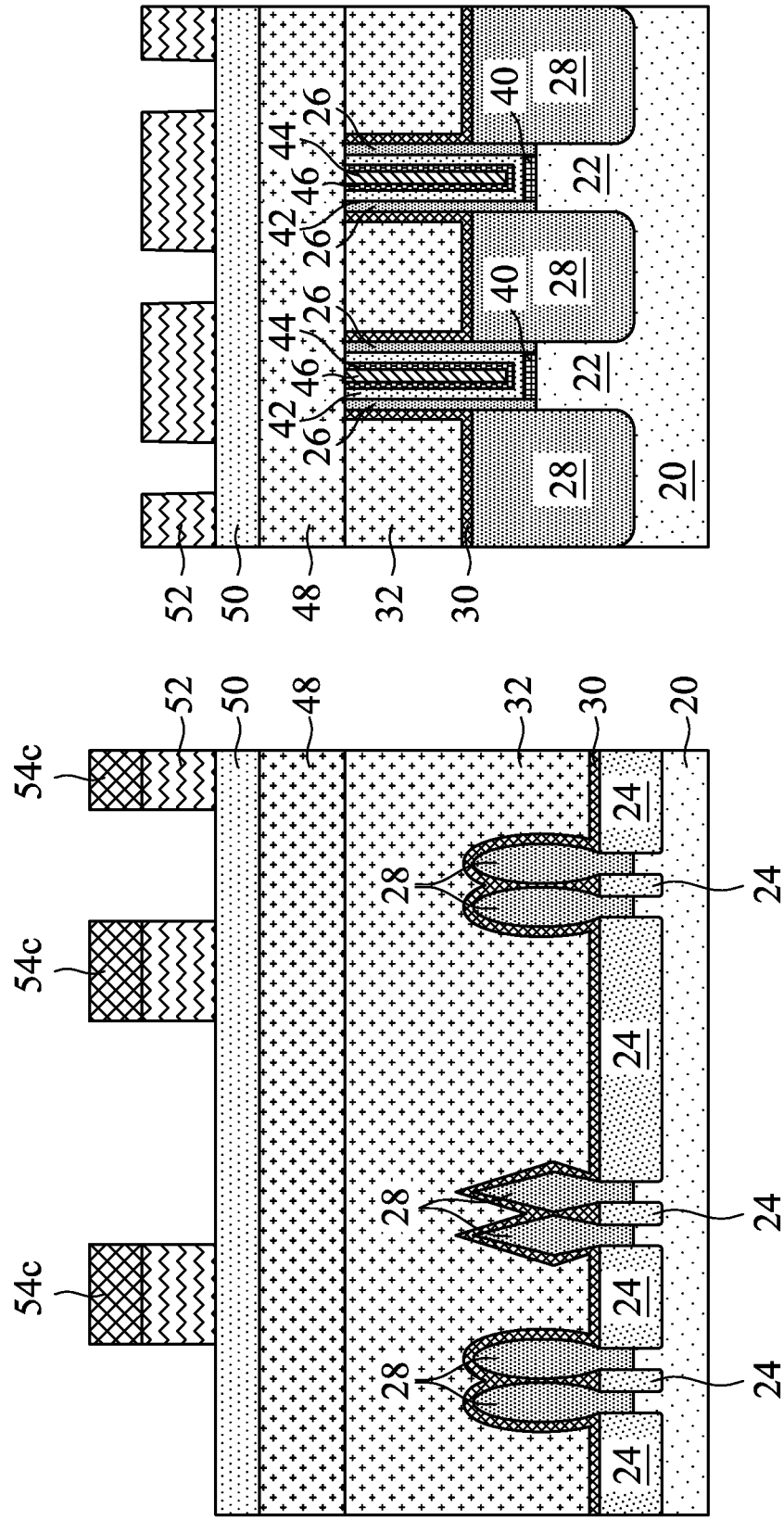

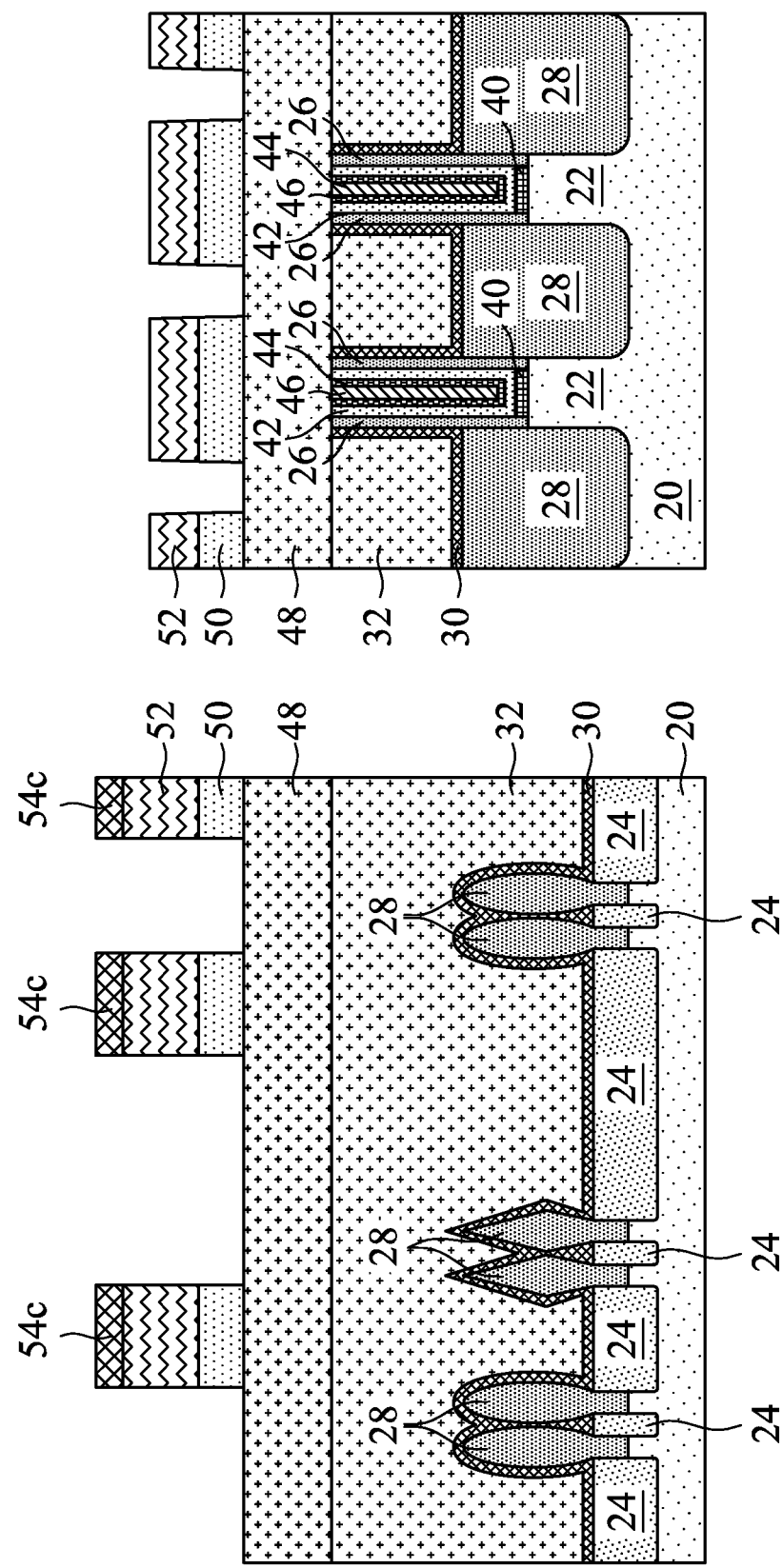

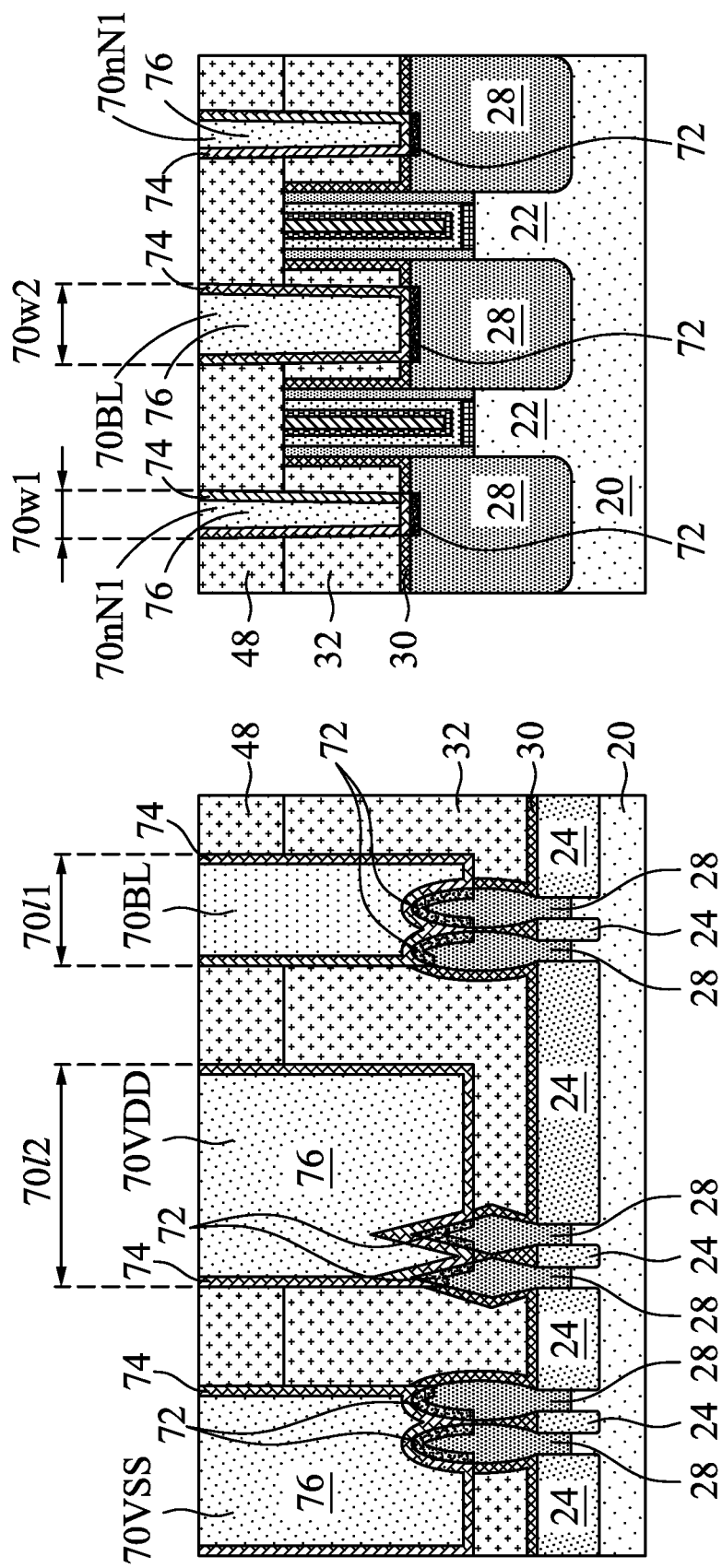

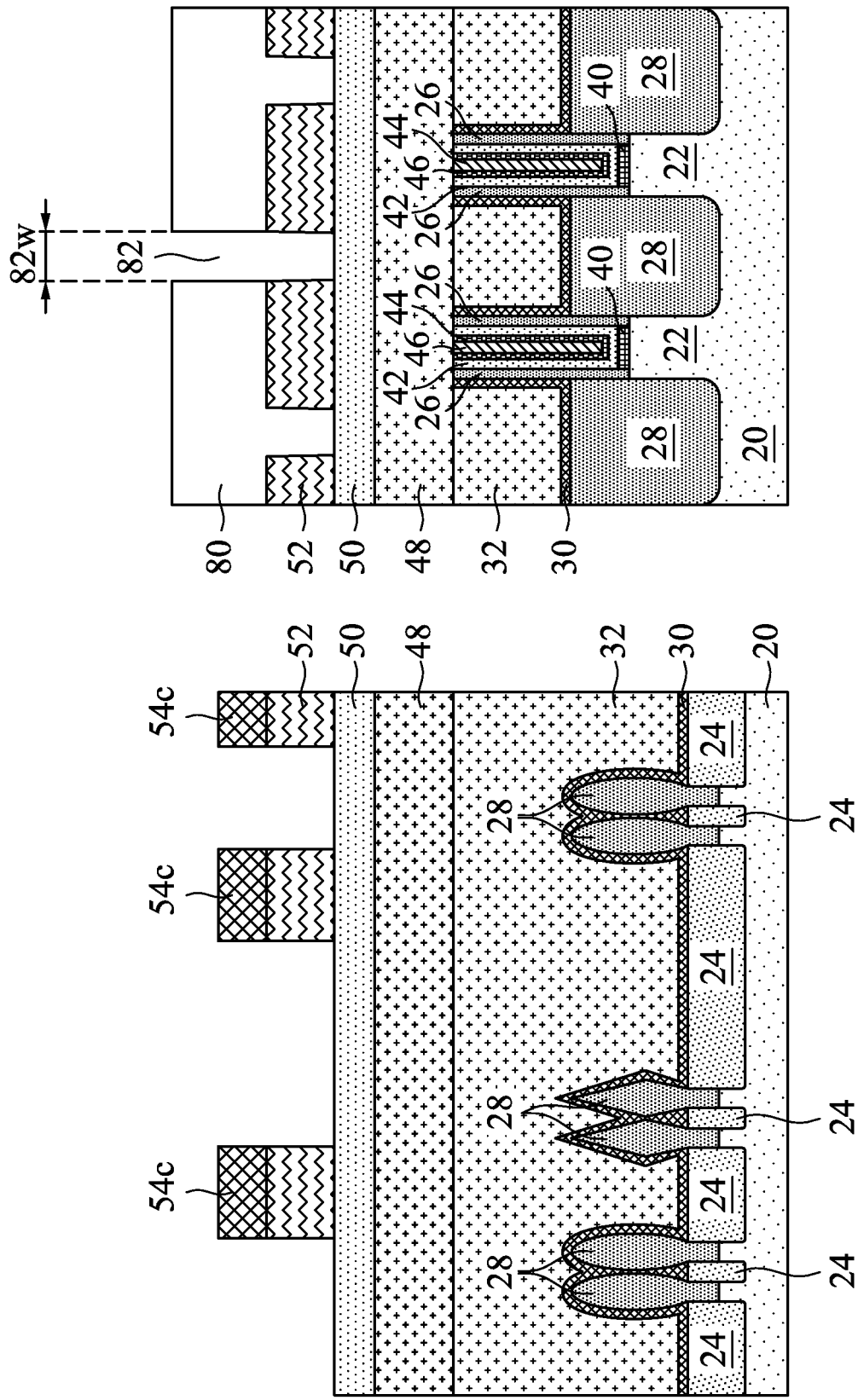

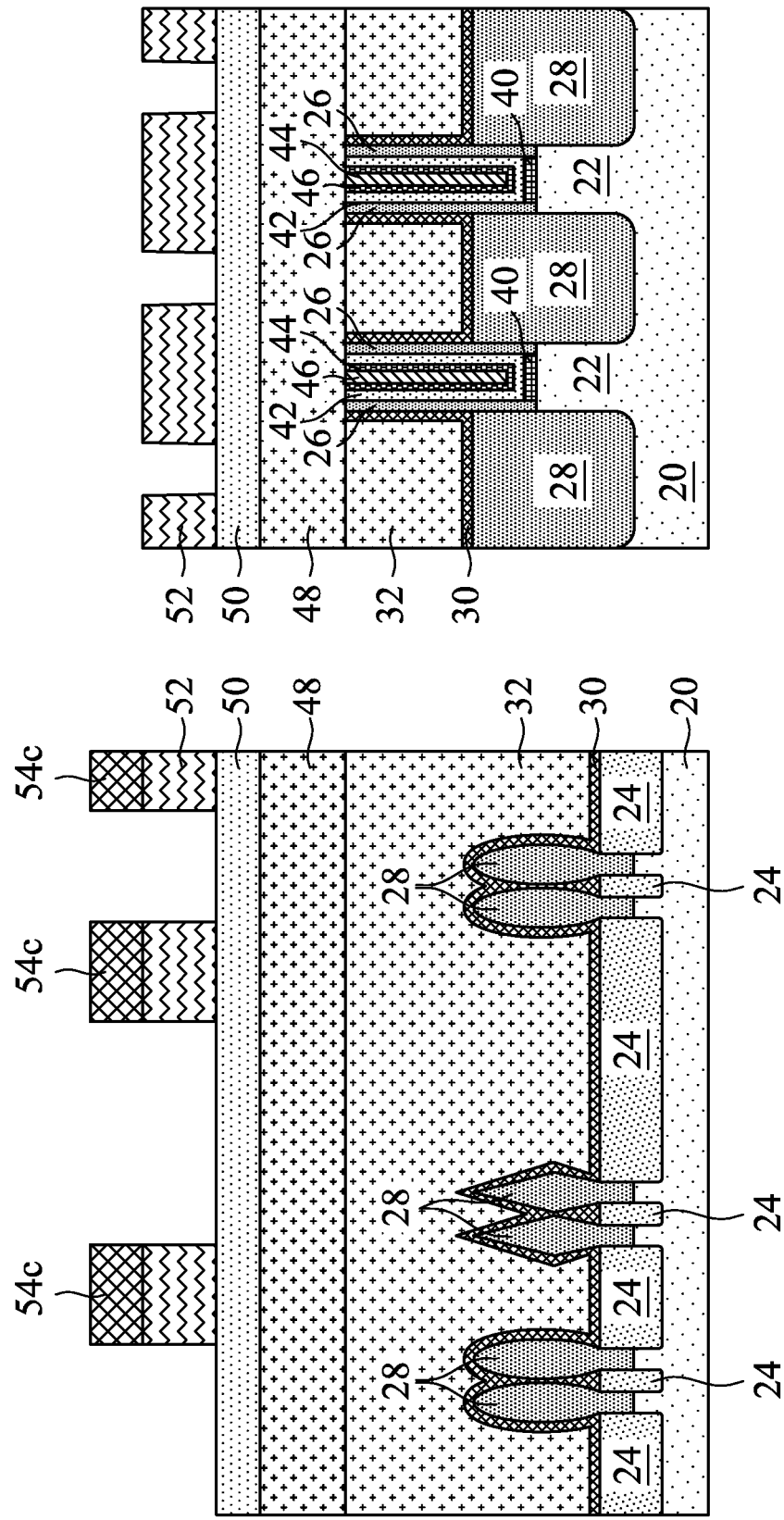

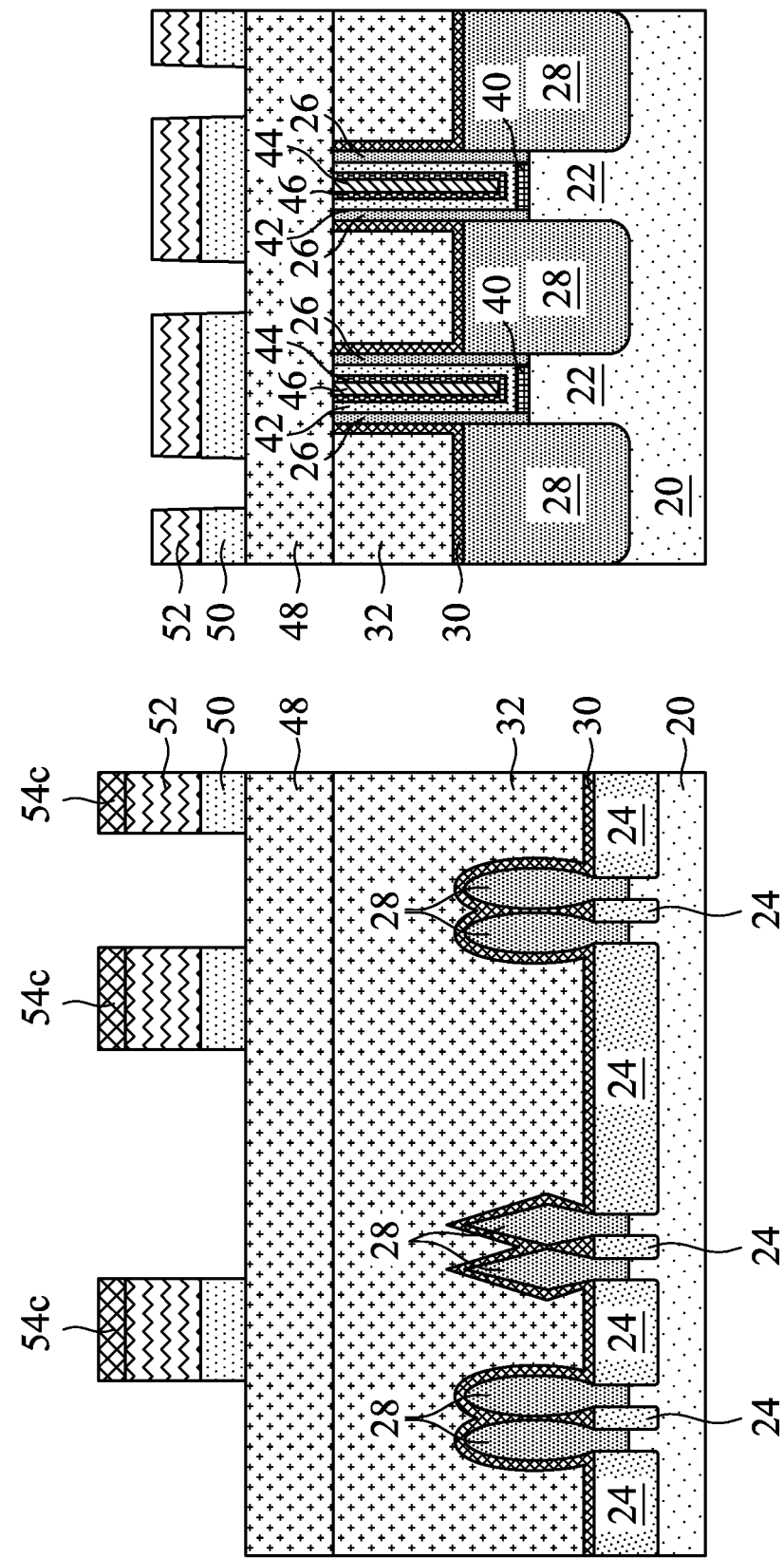

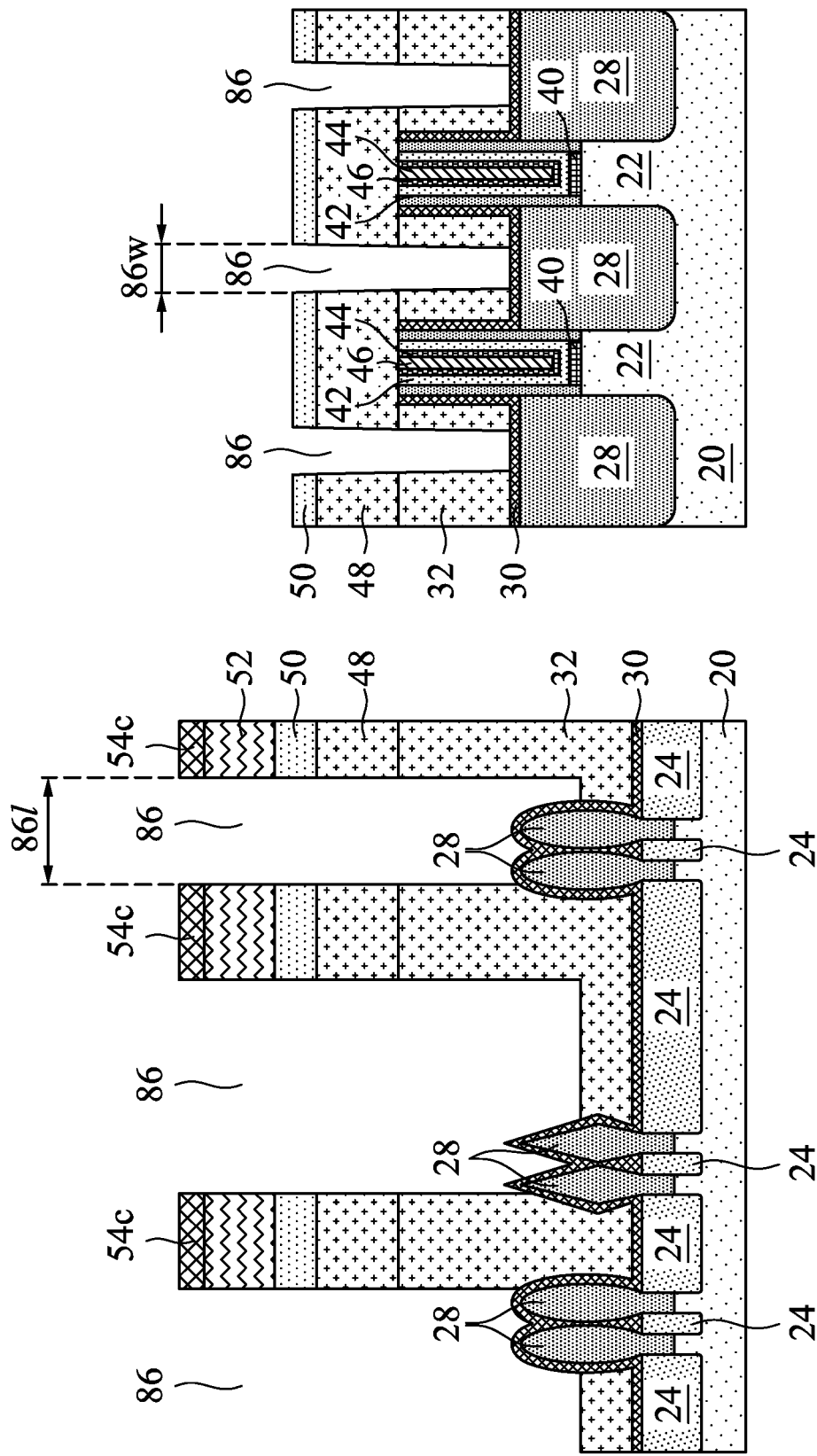

CONDUCTIVE FEATURE FORMATION

PRIORITY CLAIM AND CROSS-REFERENCE

This application is a divisional of U.S. patent application Ser. No. 16/145,432, filed on Sep. 28, 2018, entitled "Conductive Feature Formation", which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, and 10C are views of respective intermediate structures at respective stages during an example process for forming an SRAM structure in accordance with some embodiments.

FIGS. 11A, 11B, 11C, 12A, 12B, 12C, 13A, 13B, 13C, 14A, 14B, 14C, 15A, 15B, 15C, 16A, 16B, and 16C are views of respective intermediate structures at respective stages during another example process for forming an SRAM structure in accordance with some embodiments.

DETAILED DESCRIPTION

Figure 1:
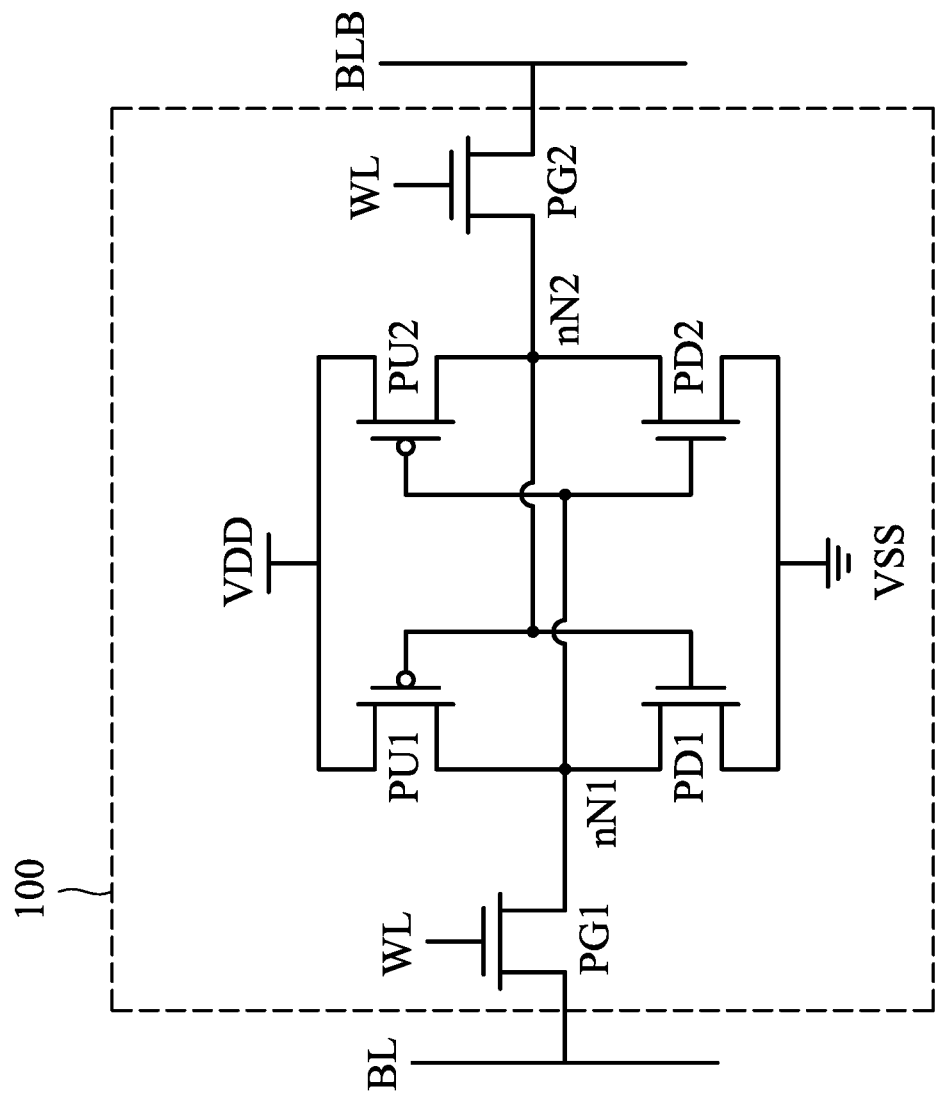
FIG. 1 is a circuit schematic of a static random access memory (SRAM) cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides some example embodiments relating to conductive features, and methods of forming the conductive features, that have differing dimensions. In some applications, conductive features having differing lateral dimensions may be implemented. With the downscaling of feature sizes, filling of conductive features with a conductive material may become more challenging. In examples described herein, some conductive features that have a smaller length than other conductive features can be formed with a larger width than the other conductive features. By increasing the width of these conductive features that have a smaller length, gap fill by the conductive material that forms the conductive features can be improved. Further, the width of the conductive features that have larger lengths may be reduced, which can increase a processing window between those conductive features and proximate gate structures. Other benefits can be achieved.

Example embodiments described herein are described in the context of forming conductive features to source/drain regions in a static random access memory (SRAM) structure. Other embodiments may be implemented in other contexts, such as where other conductive features may be formed with different sizes in Front End Of the Line (FEOL) processing, Middle End Of the Line (MEOL) processing, and Back End Of the Line (BEOL) processing. Example embodiments may have broad applicability to form opening sizes for conductive features. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIG. 1 illustrates a circuit schematic of a static random access memory (SRAM) cell 100. The SRAM cell 100 includes first and second pass-gate transistors PG1 and PG2, first and second pull-up transistors PU1 and PU2, and first and second pull-down transistors PD1 and PD2. A first source/drain of the first pass-gate transistor PG1 is electrically coupled to a bit line node BL, and a second source/drain of the first pass-gate transistor PG1 is electrically coupled to a first intra-cell node nN1. The gate of the first pass-gate transistor PG1 is electrically coupled to a word line node WL. A first source/drain of the second pass-gate transistor PG2 is electrically coupled to a complementary bit line node BLB, and a second source/drain of the second pass-gate transistor PG2 is electrically coupled to a second intra-cell node nN2. The gate of the second pass-gate transistor PG2 is electrically coupled to a word line node WL.

The first pull-up and pull-down transistors PU1 and PD1 and the second pull-up and pull-down transistors PU2 and PD2 form cross-coupled inverters to form a memory element. The sources of the first and second pull-up transistors PU1 and PU2 are electrically coupled to a first power node VDD, and sources of the first and second pull-down transistors PD1 and PD2 are electrically coupled to a second power node VSS (e.g., ground). The drains of the first pull-up and pull-down transistors PU1 and PD1 are electrically coupled together and to the first intra-cell node nN1, which is further electrically coupled to the gates of the second pull-up and pull-down transistors PU2 and PD2. The drains of the second pull-up and pull-down transistors PU2 and PD2 are electrically coupled together and to the second intra-cell node nN2, which is further electrically coupled to the gates of the first pull-up and pull-down transistors PU1 and PD1. As illustrated in FIG. 1, the pass-gate transistors PG1 and PG2 and the pull-down transistors PD1 and PD2 are n-type field effect transistors (nFETs), and the pull-up transistors PU1 and PU2 are p-type FETs (pFETs). A person having ordinary skill in the art will readily understand the operation of the SRAM cell 100.

Figure 2:
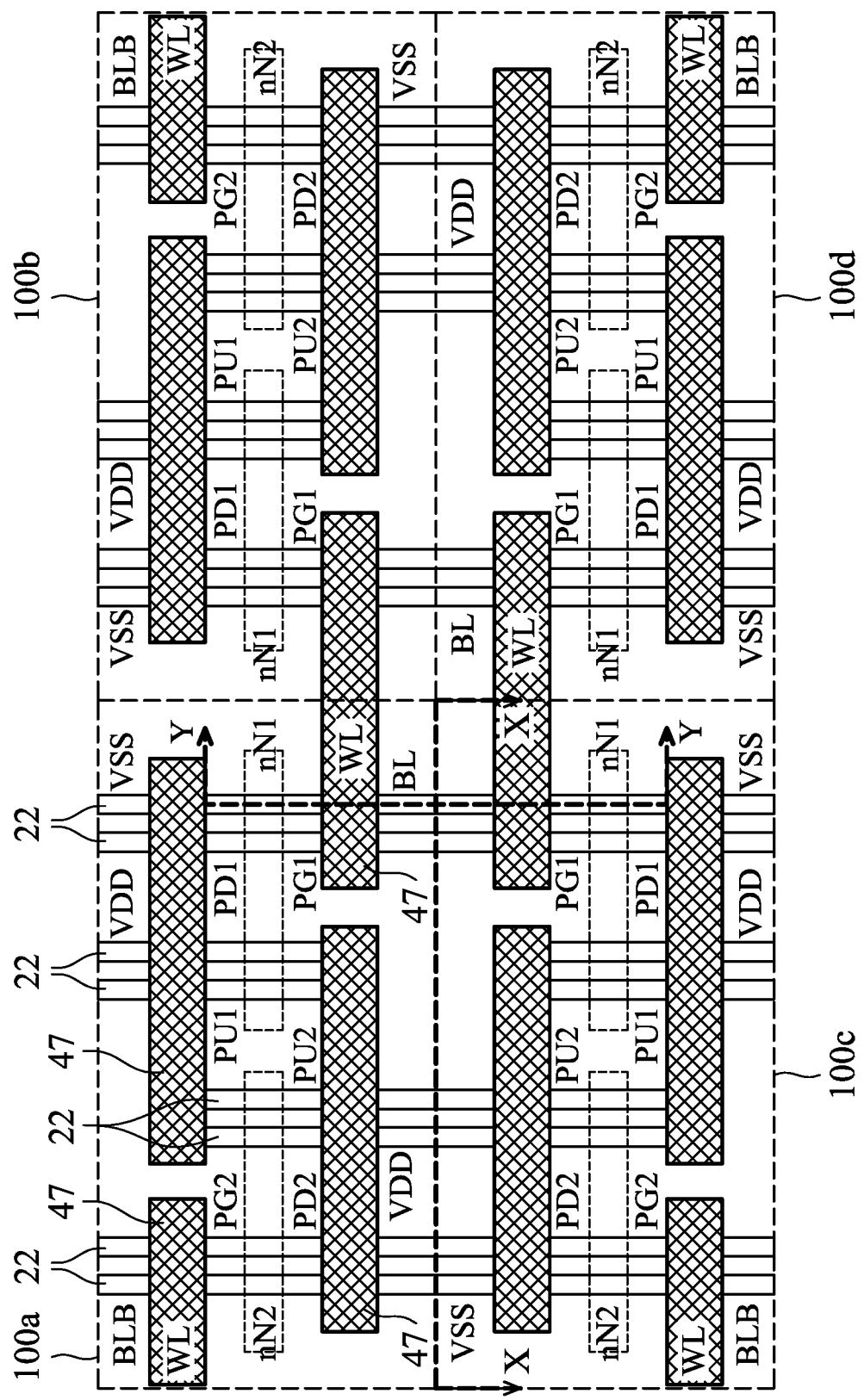
FIG. 2 is a layout of four SRAM cells in accordance with some embodiments.

FIG. 2 illustrates a layout of four SRAM cells 100a, 100b, 100c, and 100d (each implementing the SRAM cell 100 of FIG. 1) in accordance with some embodiments. The SRAM cell 100a includes fins 22 on a semiconductor substrate 20 (to be described subsequently). The fins 22 form the active areas of the transistors of the SRAM cell 100a. As illustrated, two fins 22 form each active area of a respective transistor, although in other examples, one, three, or more fins can form an active area of a transistor. Further, each transistor of the SRAM cell 100a can include any number of fins as the active area, which may be the same or different from other transistors within the SRAM cell 100a. The SRAM cell 100a further includes gate structures 47. The various fins 22 and gate structures 47 together form the transistors described in the SRAM cell 100 in FIG. 1. The layout of the SRAM cell 100a is mirrored along an interface between the SRAM cell 100a and the SRAM cell 100b to form the layout of the SRAM cell 100b. Similarly, the layout of the SRAM cell 100a is mirrored along an interface between the SRAM cell 100a and the SRAM cell 100c to form the layout of the SRAM cell 100c. The layout of the SRAM cell 100c is mirrored along an interface between the SRAM cell 100c and the SRAM cell 100d to form the layout of the SRAM cell 100d. A person having ordinary skill in the art will readily understand various features and aspects of this layout that are not explicitly described herein. Some features of this layout are described below in the context of other figures. The layout of the four SRAM cells in FIG. 2 can be repeated any number of times to implement an SRAM array having any size.

FIG. 2 further illustrates a cross-section X-X along the interface between the SRAM cells 100a and 100c, and illustrates a cross-section Y-Y that is perpendicular to the cross-section X-X and is along a fin 22 that forms the first pass gate transistors PG1 in the SRAM cells 100a and 100c. Subsequent figures with an "A" designation illustrate layouts of intermediate structures at various stages of fabrication that correspond to the layout of FIG. 2. Subsequent figures with a "B" designation illustrate cross-sectional views of the intermediate structures at various stages of fabrication that correspond to cross-section X-X in FIG. 2. Subsequent figures with a "C" designation illustrate cross-sectional views of the intermediate structures at various stages of fabrication that correspond to cross-section Y-Y in FIG. 2.

FIGS. 3A-3C through 10A-10C illustrate views of respective intermediate structures at respective stages during an example process for forming an SRAM structure in accordance with some embodiments.

Figure 3A:
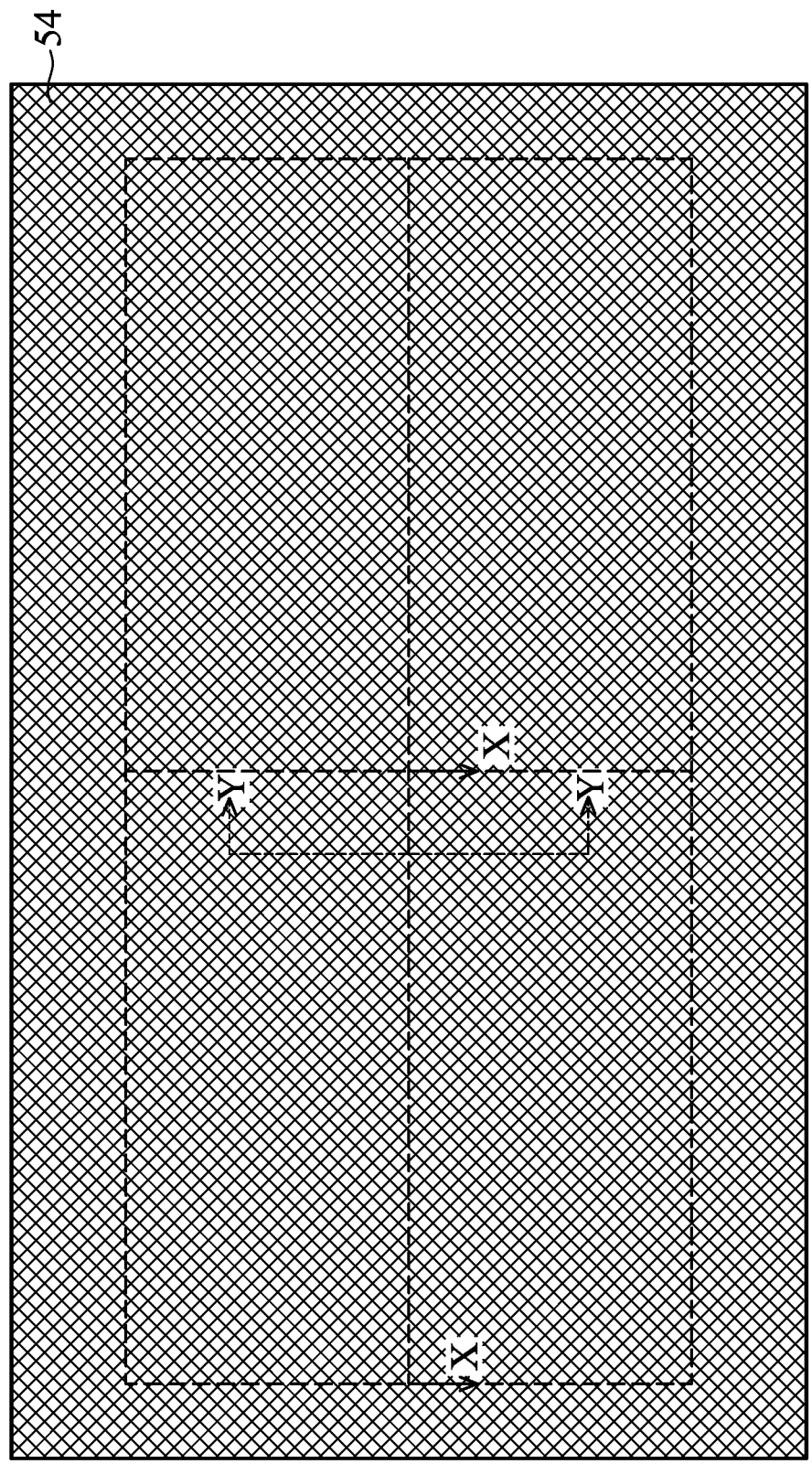
Figure 3C:
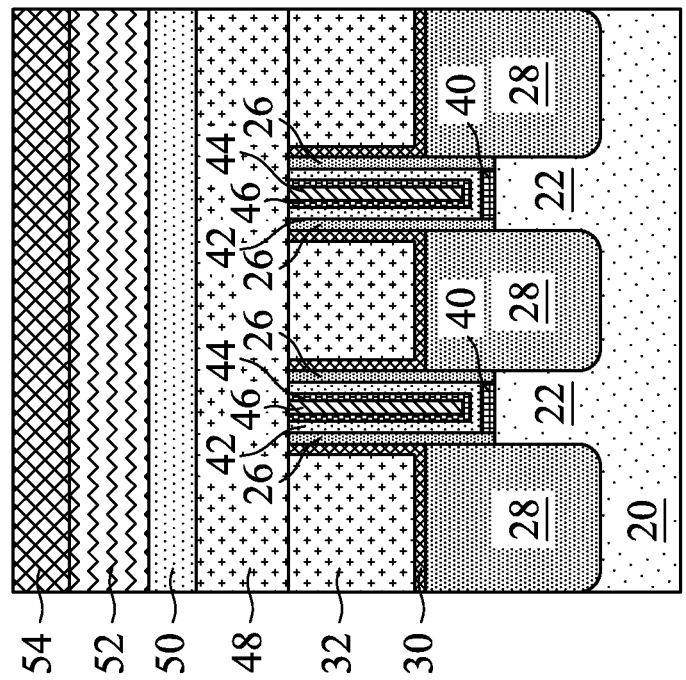
Figure 3B:
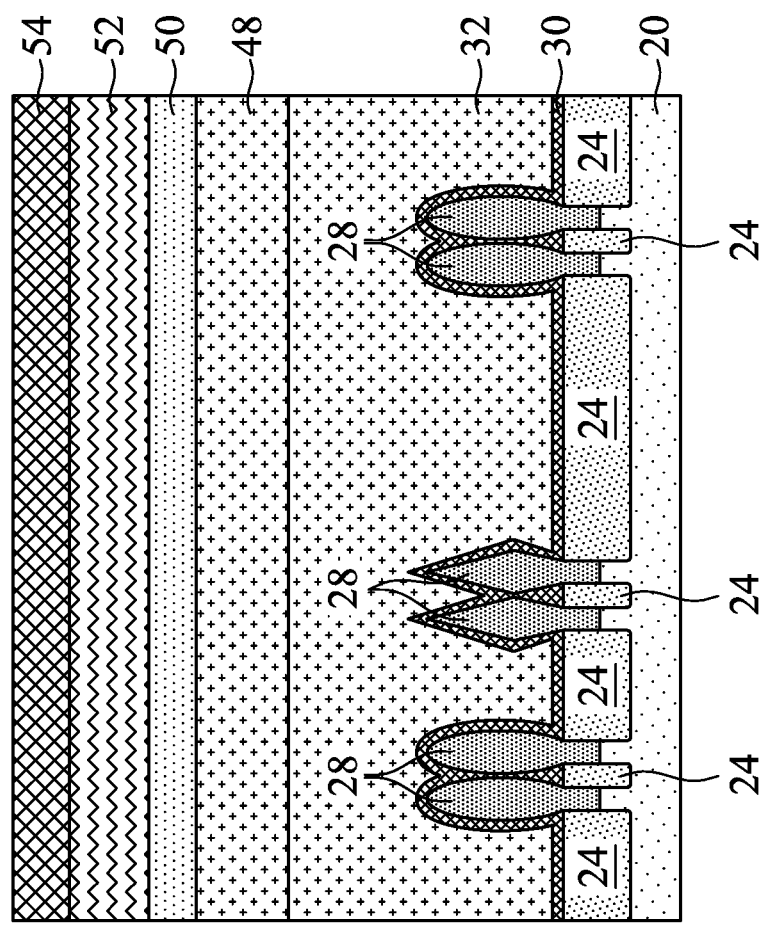

FIGS. 3A, 3B, and 3C illustrate the formation of a tri-layer mask over FinFET structures that are formed. The formation of the FinFET structures is according to the layout of FIG. 2 and is described briefly below.

Referring to FIGS. 3B and 3C, fins 22 are formed on a semiconductor substrate 20. The semiconductor substrate 20 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 20 may include an elemental semiconductor such as silicon (Si) or germanium (Ge); a compound semiconductor including; an alloy semiconductor; or a combination thereof.

The fins 22 are formed on the semiconductor substrate 20, such as by etching trenches in the semiconductor substrate 20 to form the fins 22 (which include a semiconductor material of the semiconductor substrate 20). The fins 22 may be patterned in the semiconductor substrate 20 by any suitable method. For example, the fins 22 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 22.

Isolation structures 24 are formed with each being in a corresponding trench. The isolation structures 24 may include or be an insulating material such as an oxide (such as silicon oxide), a nitride, the like, or a combination thereof, and the insulating material may be deposited using an appropriate deposition process. The insulating material may be recessed after being deposited to form the isolation structures 24. The insulating material is recessed such that the fins 22 protrude from between neighboring isolation structures 24, which may, at least in part, thereby delineate the fins 22 as active areas on the semiconductor substrate 20. A person having ordinary skill in the art will readily understand that the processes described above are just examples of how fins 22 may be formed. In other examples, the fins 22 may be formed by other processes and may include heteroepitaxial and/or homoepitaxial structures.

Dummy gate stacks (or more generally, gate structures) (not illustrated) are formed across the fins 22 and isolation structures 24. The dummy gate stacks are formed where the gate structures 47 illustrated in FIG. 3C are formed, as will become apparent. The dummy gate stacks extend longitudinally perpendicularly to respective longitudinal directions of the fins 22. Each dummy gate stack can include an interfacial dielectric along and on the fins 22, a dummy gate over the interfacial dielectric, and a mask over the dummy gate.

The interfacial dielectrics may include or be silicon oxide, silicon nitride, the like, or multilayers thereof. The dummy gates may include or be silicon (e.g., amorphous silicon or polysilicon) or another material. The masks may include or be silicon nitride, silicon oxynitride, silicon carbon nitride, the like, or a combination thereof. Layers for the interfacial dielectrics, dummy gates, and masks for the dummy gate stacks may be sequentially deposited or formed, such as by any acceptable deposition technique, and then patterned, for example, using photolithography and one or more etch processes, into the dummy gate stacks.

Gate spacers 26 are formed along sidewalls of the dummy gate stacks and over the fins 22. The gate spacers 26 may be formed by conformally depositing one or more layers for the gate spacers 26 and anisotropically etching the one or more layers, for example, by appropriate processes. The one or more layers for the gate spacers 26 may include or be silicon nitride, silicon oxynitride, silicon carbon nitride, the like, multi-layers thereof, or a combination thereof.

Recesses are then formed in the fins 22 on opposing sides of the dummy gate stacks. The recessing can be by an etch process. The etch process can be isotropic or anisotropic, or further, may be selective with respect to one or more crystalline planes of the semiconductor substrate 20. Hence, the recesses can have various cross-sectional profiles based on the etch process implemented.

Epitaxial source/drain structures 28 are formed in the recesses. The epitaxial source/drain structures 28 for different conductivity type FinFET structures can be formed of different materials, for example. In such examples, appropriate masking can be performed to mask one region while forming epitaxial source/drain structures 28 in another region. Regions with n-type FinFET structures (such as regions that include the pass-gate transistors PG1 and PG2 and the pull-down transistors PD1 and PD2) can be masked while epitaxial source/drain structures 28 are epitaxially grown in recesses in fins 22 of p-type FinFET structures (such as in regions that include the pull-up transistors PU1 and PU2). Conversely, regions p-type FinFET structures can be masked while epitaxial source/drain structures 28 are epitaxially grown in recesses in fins 22 of n-type FinFET structures.

The epitaxial source/drain structures 28 may include or be silicon germanium, germanium, silicon carbide, silicon phosphorus, silicon carbon phosphorus, a III-V compound semiconductor, a II-VI compound semiconductor, or the like. A person having ordinary skill in the art will readily understand materials that can be implemented for n-type FinFET structures and for p-type FinFET structures.

The epitaxial source/drain structures 28 may be formed in the recesses by epitaxial growth with appropriate deposition processes. In some examples, some epitaxial source/drain structures 28 may be formed with facets (which may correspond to crystalline planes of the semiconductor substrate 20), such as shown in FIG. 3B. In some examples, some epitaxial source/drain structures 28 may be formed with different cross-sectional profiles, such as also shown in FIG. 3B, which may be a result of different materials being epitaxially grown and/or growing the materials under different process conditions. Further, the epitaxial source/drain structures 28 may be formed at a raised height with respect to the respective fin 22, such as shown in FIG. 3C. In some examples, epitaxial source/drain structures 28 in some fins 22 can be epitaxially grown to merge together, such as due to proximity to neighboring fins 22.

In some examples, the epitaxial source/drain structures 28 may also be doped, such as by in situ doping during epitaxial growth and/or by implanting dopants into the epitaxial source/drain structures 28 after epitaxial growth. Hence, a source/drain region may be delineated by doping (e.g., by in situ doping during epitaxial growth) and/or by epitaxial growth, which may further delineate the active area in which the source/drain region is delineated.

A contact etch stop layer (CESL) 30 is conformally deposited on surfaces of the epitaxial source/drain structures 28, sidewalls and top surfaces of the gate spacers 26, top surfaces of the masks, and top surfaces of the isolation structures 24. An etch stop layer can provide a mechanism to stop an etch process when forming, e.g., contacts or vias by having a different etch selectivity from adjacent layers or components. The CESL 30 may comprise or be silicon nitride, silicon carbon nitride, carbon nitride, the like, or a combination thereof, and may be deposited by any appropriate conformal deposition process.

A first interlayer dielectric (ILD) 32 is formed over the CESL 30. The first ILD 32 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, silicon carbon material, a compound thereof, a composite thereof, the like, or a combination thereof. The first ILD 32 may be deposited by any acceptable deposition process.

The first ILD 32 and CESL 30 are formed with top surfaces coplanar with top surfaces of the dummy gates, such as by a planarization process, such as a CMP. The CMP may also remove the masks (and, in some instances, upper portions of the gate spacers 26) on the dummy gates. Accordingly, top surfaces of the dummy gates are exposed through the first ILD 32 and the CESL 30. With the dummy gates exposed through the first ILD 32 and the CESL 30, the dummy gates are removed, such as by one or more acceptable etch processes. Recesses are formed between gate spacers 26 where the dummy gate stacks are removed, and channel regions of the fins 22 are exposed through the recesses.

Replacement gate structures 47 are formed in the recesses where the dummy gate stacks were removed. The replacement gate structures 47 (not specifically numbered in FIG. 3C) each include, as illustrated, an interfacial dielectric 40, a gate dielectric layer 42, one or more optional conformal layers 44, and a gate conductive fill material 46. The interfacial dielectric 40, the gate dielectric layer 42, the one or more optional conformal layers 44, and the gate conductive fill material 46 can be deposited by any appropriate deposition technique. The interfacial dielectric 40 is formed on sidewalls and top surfaces of the fins 22 along the channel regions. The interfacial dielectric 40 can be, for example, the interfacial dielectric of the dummy gate stack if not removed, an oxide (e.g., silicon oxide), a nitride (e.g., silicon nitride), and/or another dielectric layer. The interfacial dielectric 40, or a subsequently deposited dielectric layer, is along sidewall and top surfaces of the fins 22 and on top surfaces of the isolation structures 24.

The gate dielectric layer 42 can be conformally deposited in the recesses where dummy gate stacks were removed (e.g., on sidewall and top surfaces of the fins 22, on sidewalls of the gate spacers 26, and on top surfaces of the isolation structures 24) and on the top surfaces of the first ILD 32, the CESL 30, and gate spacers 26. The gate dielectric layer 42 can be or include silicon oxide, silicon nitride, a high-k dielectric material, multilayers thereof, or other dielectric material. A high-k dielectric material may include a metal oxide of or a metal silicate of hafnium (Hf), aluminum (Al), zirconium (Zr), lanthanum (La), magnesium (Mg), barium (Ba), titanium (Ti), lead (Pb), or a combination thereof.

Then, the one or more optional conformal layers 44 can be conformally (and sequentially, if more than one) deposited on the gate dielectric layer 42. The one or more optional conformal layers 44 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layers may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

The gate conductive fill material 46 is formed over the one or more optional conformal layers 44, if implemented, and/or the gate dielectric layer 42. The gate conductive fill material 46 can fill remaining recesses where the dummy gate stacks were removed. The gate conductive fill material 46 may be or comprise a metal-containing material such as tungsten, cobalt, aluminum, ruthenium, copper, multi-layers thereof, a combination thereof, or the like. A planarization process, such as a CMP, may remove excess gate conductive fill material 46, one or more optional conformal layers 44, and gate dielectric layer 42. The replacement gate structures 47 comprising the gate conductive fill material 46, one or more optional conformal layers 44, gate dielectric layer 42, and interfacial dielectric 40 may therefore be formed as illustrated in FIG. 3C.

A second ILD 48 is formed over the first ILD 32, CESL 30, gate spacers 26, and replacement gate structures 47. The second ILD 48 may comprise or be silicon dioxide, a low-k dielectric material, silicon oxynitride, PSG, BSG, BPSG, USG, FSG, OSG, $SiO_xC_y$, silicon carbon material, a compound thereof, a composite thereof, the like, or a combination thereof. The second ILD 48 may be deposited by any appropriate deposition process.

The tri-layer mask is formed over the second ILD 48. The tri-layer mask includes a first sub-layer 50, a second sub-layer 52, and a third sub-layer 54. The first sub-layer 50 is formed over the second ILD 48. The second sub-layer 52 is formed over the first sub-layer 50. The third sub-layer 54 is formed over the second sub-layer 52. The first sub-layer 50, second sub-layer 52, and third sub-layer 54 are or include different materials from each other so as to provide etch selectivity when etching the tri-layer mask. Any appropriate materials may be implemented for the first sub-layer 50, second sub-layer 52, and third sub-layer 54. In some specific examples, the first sub-layer 50 is or includes a metal-containing material, such as a metal nitride (e.g., titanium nitride (TiN)) or metal carbide (e.g., tungsten carbide (WC)); the second sub-layer 52 is or includes an oxide (e.g., silicon oxide ($SiO_x$)); and the third sub-layer 54 is or includes silicon (e.g., amorphous silicon or polysilicon). The first sub-layer 50, second sub-layer 52, and third sub-layer 54 can be deposited by any appropriate deposition process, such as chemical vapor deposition (CVD), physical vapor deposition (PVD), spin-on coating, or the like. In some examples, a thickness of the first sub-layer 50 is in a range from about 15 nm to about 40 nm; a thickness of the second sub-layer 52 is in a range from about 20 nm to about 60 nm; and a thickness of the third sub-layer 54 is in a range from about 20 nm to about 50 nm.

Figure 4A:
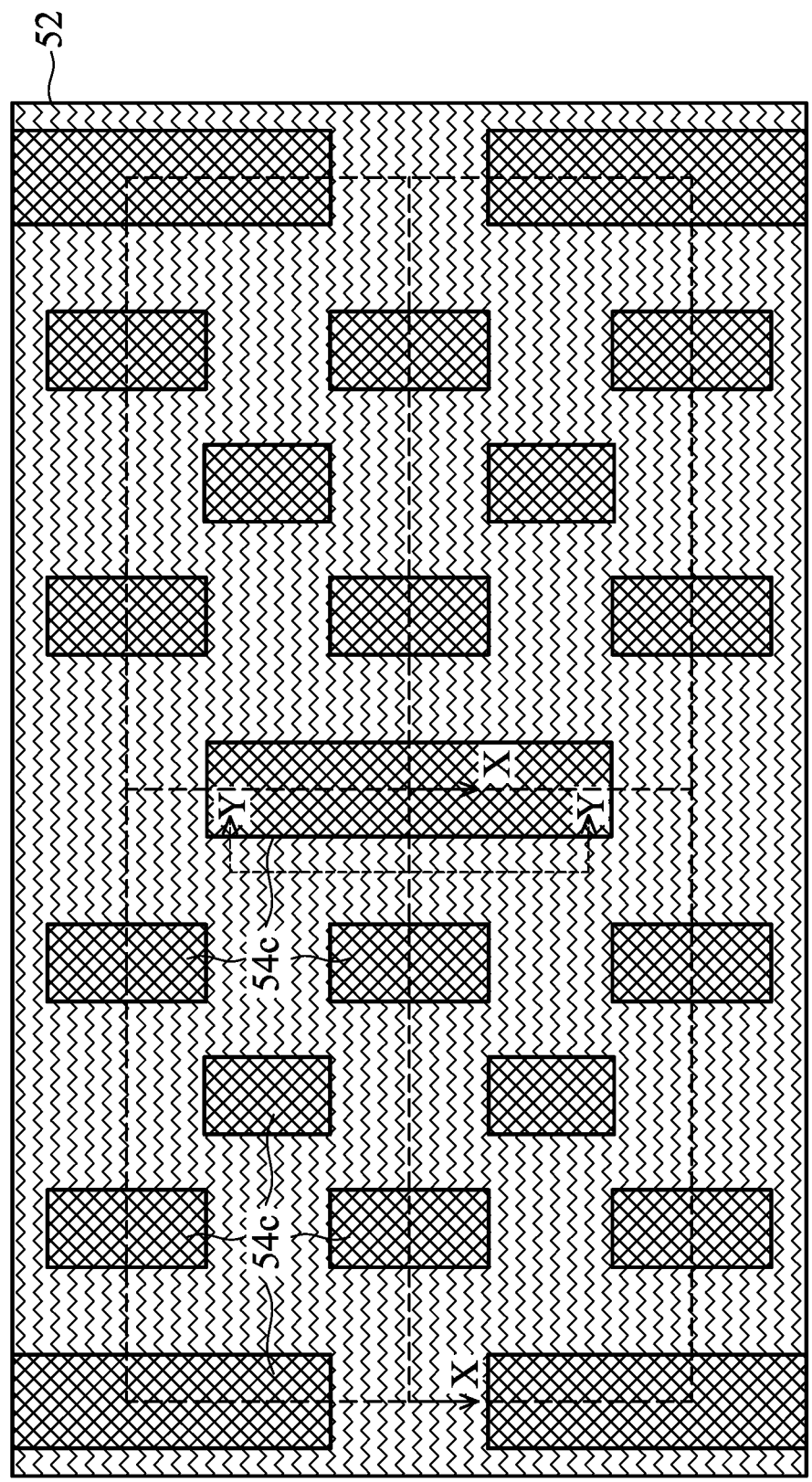

FIGS. 4A, 4B, and 4C illustrate the formation of cut portions 54c from the third sub-layer 54 of the tri-layer mask. The cut portions 54c, as will become apparent subsequently, are formed at locations that intersect trenches that are to be implemented in subsequent photolithography processes. By intersecting these trenches, the cut portions 54c will substantially define lateral boundaries of openings (e.g., boundaries that intersect a cross-section parallel to the cross-section X-X) that are to be formed to various components of the FinFET structures. The cut portions 54c can be formed using appropriate photolithography and etch processes. The etch process can be an anisotropic etch, such as a reactive ion etch (RIE), an inductively coupled plasma (ICP) etch, or another etch process, that selectively etches the third sub-layer 54 without significantly etching the second sub-layer 52.

FIGS. 5A-5C through 8A-8C illustrate double patterning using a lithography-etch-lithography-etch (LELE) process. The double patterning can permit spacing between contacts, such as along the cross-section Y-Y, to be smaller than lithography limits that a single lithography process may otherwise permit. The order of the lithography-etch processes can be altered from what is described herein. As described herein, a first lithography-etch process is performed with respect to FIGS. 5A-5C and 6A-6C, and a second, subsequent lithography-etch process is performed with respect to FIGS. 7A-7C and 8A-8C. In other examples, the lithography-etch process of FIGS. 7A-7C and 8A-8C is performed before the lithography-etch process of FIGS. 5A-5C and 6A-6C. In other examples, single patterning processes may be implemented, or other double patterning processes (or more patterning) may be implemented.

Figure 5A:
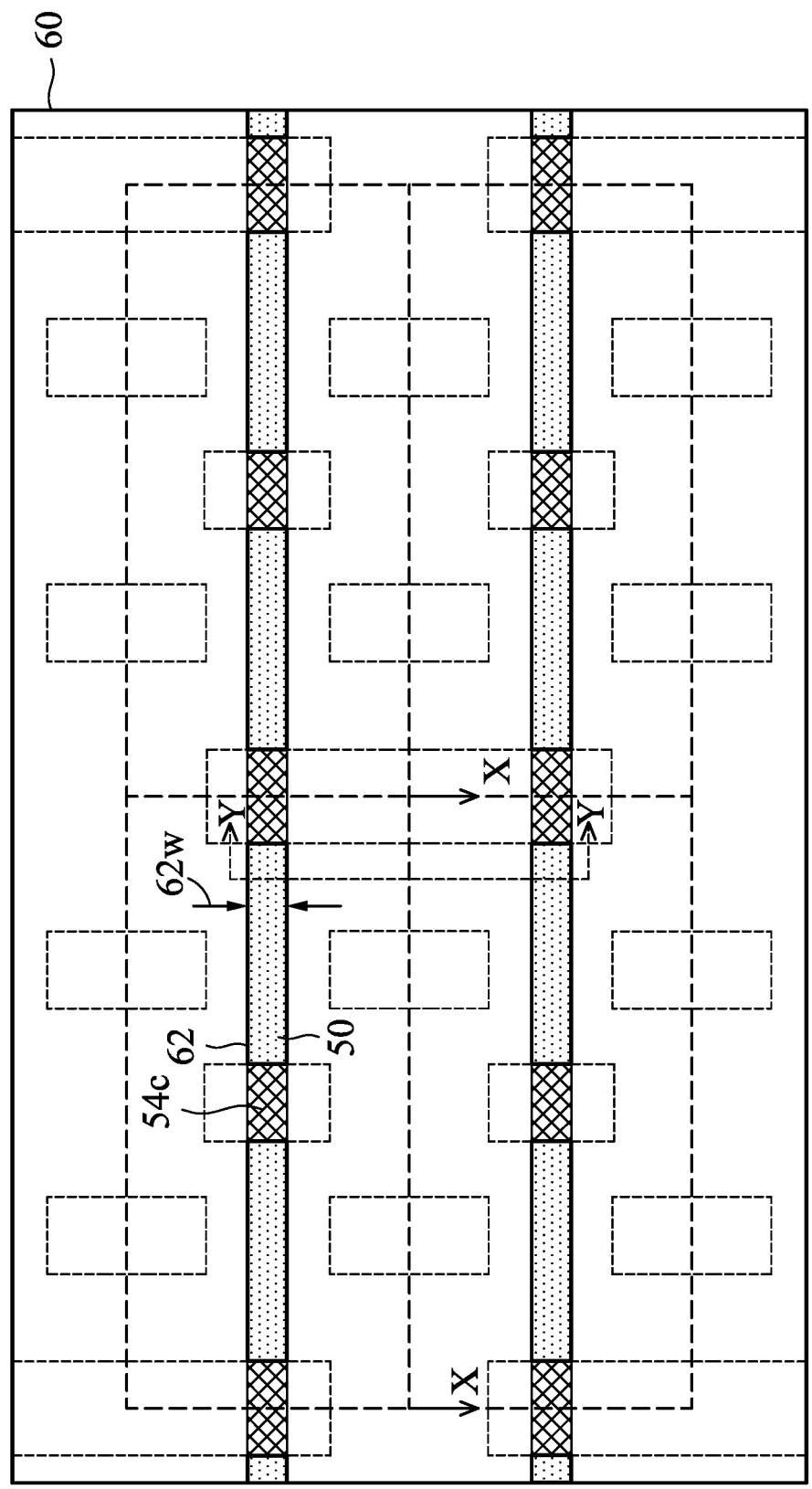
Figures 5B, 5C:
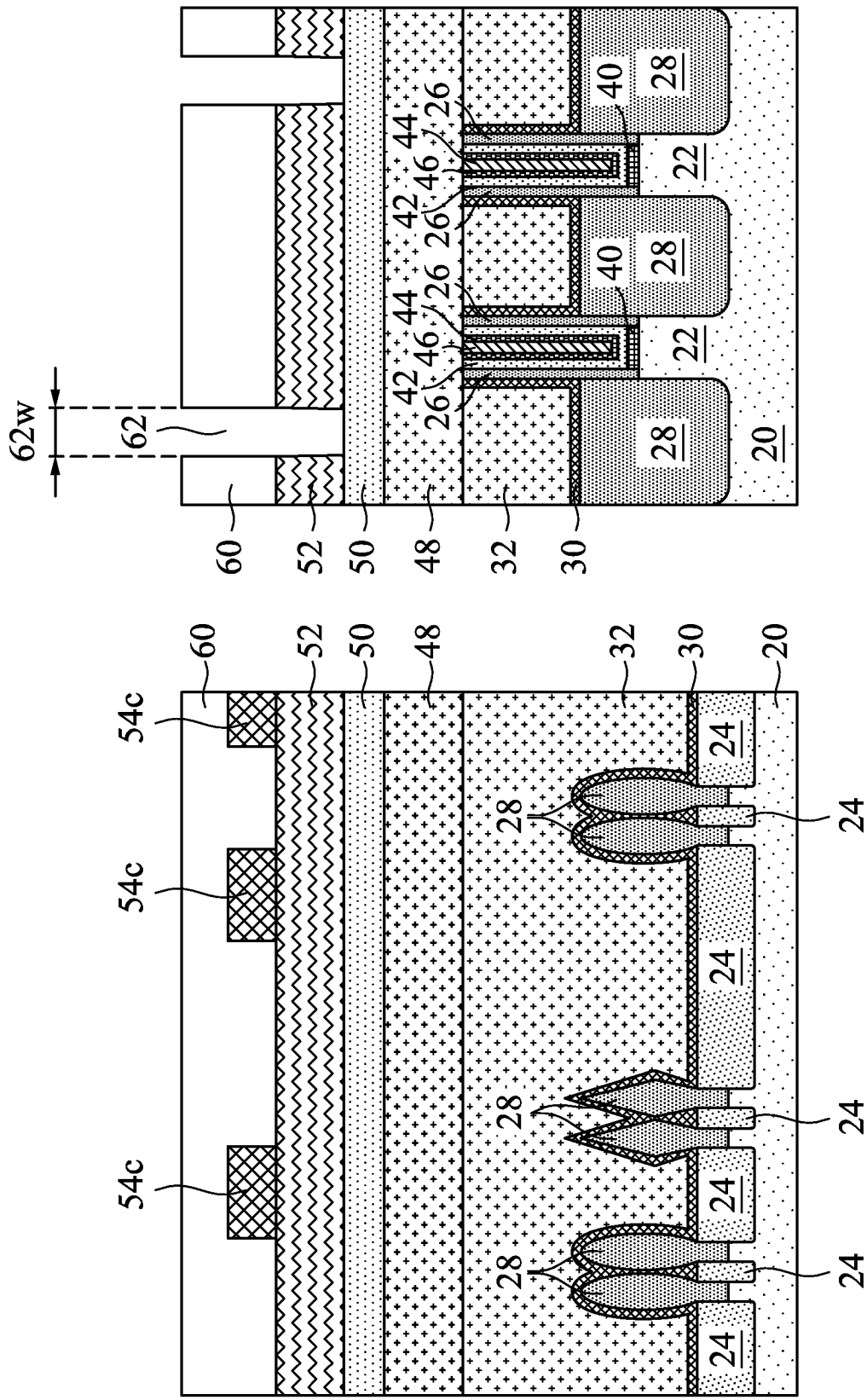

FIGS. 5A, 5B, and 5C illustrate the formation of a photoresist 60 with trenches 62 and the subsequent etching of the second sub-layer 52 through the trenches 62. The photoresist 60 can be formed on the cut portions 54c and the second sub-layer 52, such as by using spin-on coating, and patterned to have the trenches 62 by exposing the photoresist 60 to light using an appropriate photomask. Exposed or unexposed portions of the photoresist 60 may then be removed depending on whether a positive or negative resist is used. Each of the trenches 62 can extend across multiple SRAM cells. Each of the trenches 62 can have a substantially uniform width 62w across individual and multiple SRAM cells. The trenches 62 in the photoresist 60 are defined by a photomask that is used in the lithography process that patterns the photoresist 60, and hence, an exposure pattern of the photomask has patterns that correspond to the substantially uniform width 62w of the trenches 62 in the photoresist 60. The width 62w of the trenches 62 will substantially define lateral boundaries of openings (e.g., boundaries that intersect a cross-section parallel to the cross-section Y-Y) that are to be formed to various components of the FinFET structures. The width 62w of the trenches 62, in some examples, is in a range from about 8 nm to about 20 nm.

The second sub-layer 52 that is exposed through the trenches 62 is etched. The etch process can be an anisotropic etch, such as a RIE, an ICP etch, or another etch process, that selectively etches the second sub-layer 52 without significantly etching the cut portions 54c or the first sub-layer 50.

Hence, as illustrated in FIG. 5A, the cut portions 54c act as a mask for the portions of the second sub-layer 52 on which the cut portions 54c are disposed. As a result, after the etch process, cut portions 54c and the first sub-layer 50 are exposed through the trenches 62 of the photoresist 60.

Figure 6A:
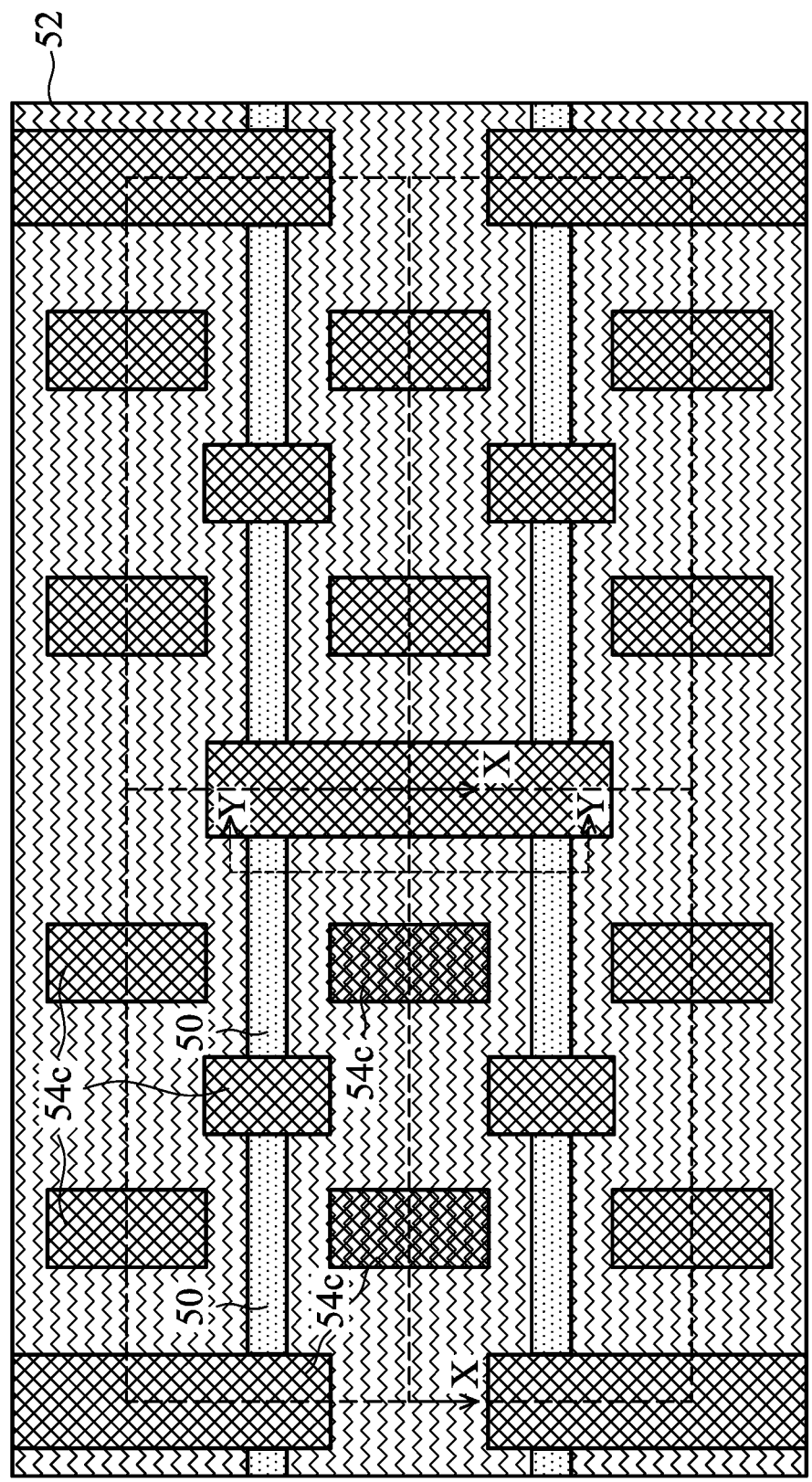

FIGS. 6A, 6B, and 6C illustrate the removal of the photoresist 60. The photoresist 60 can be removed by an ashing or wet strip processes, for example. As a result of the lithography and etch processes of FIGS. 5A-5C, openings are formed through the second sub-layer 52 to expose the first sub-layer 50. The openings through the second sub-layer 52 formed in FIGS. 5A-5C have lateral lengths that are defined by the cut portions 54c and respective widths corresponding to the width 62w of the trenches 62.

Figure 7A:
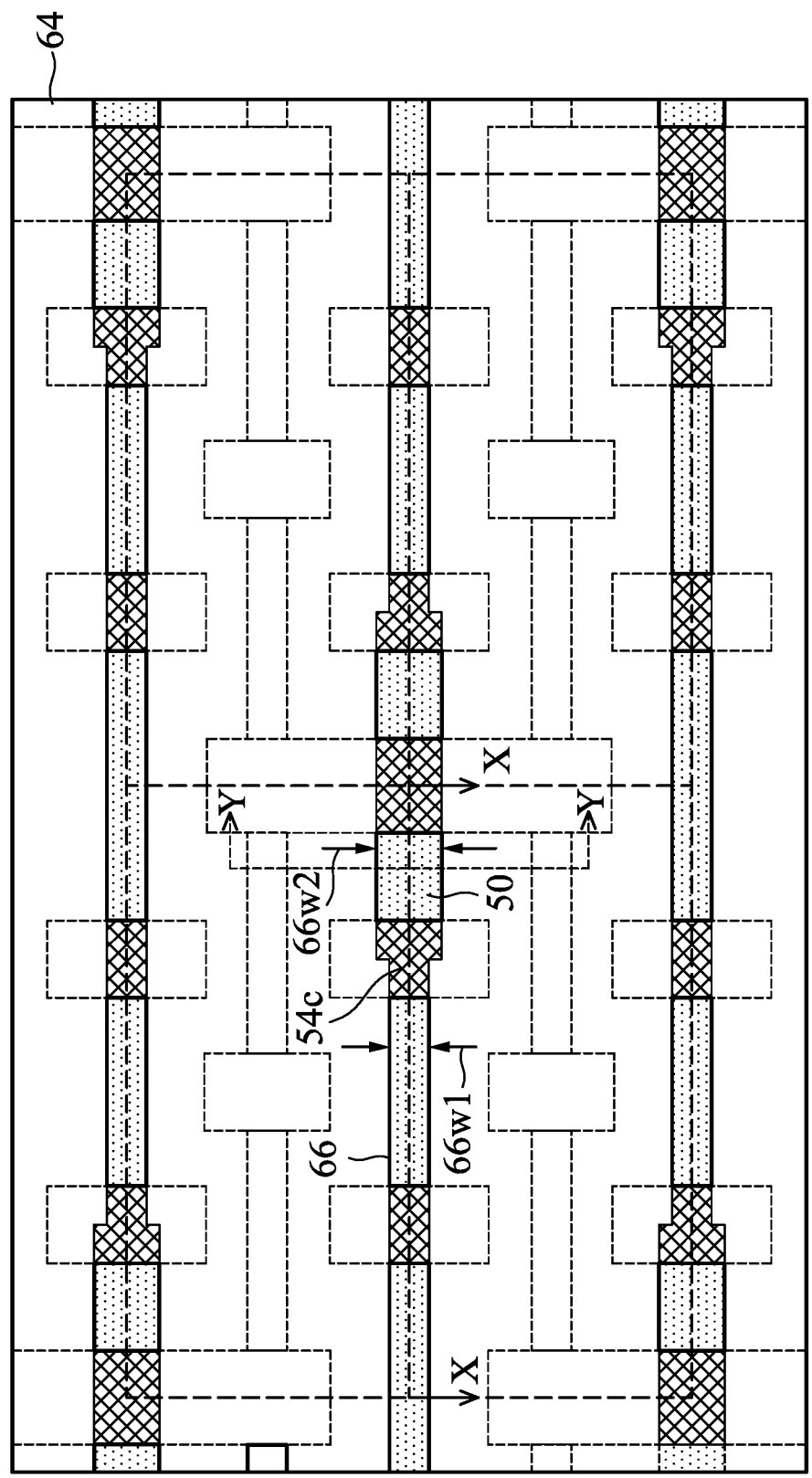

FIGS. 7A, 7B, and 7C illustrate the formation of a photoresist 64 with trenches 66 and the subsequent etching of the second sub-layer 52 through the trenches 66. The photoresist 64 can be formed on the cut portions 54c, the second sub-layer 52, and first sub-layer 50, such as by using spin-on coating, and patterned to have the trenches 66 by exposing the photoresist 64 to light using an appropriate photomask. Exposed or unexposed portions of the photoresist 64 may then be removed depending on whether a positive or negative resist is used. Each of trenches 66 of the photoresist 64 can be disposed between where respective neighboring pairs of the trenches 62 of the photoresist 60 where formed as described above with respect to FIGS. 5A-5C. Each of the trenches 66 can extend across multiple SRAM cells.

Each of the trenches 66 can have a varying width depending upon the location of the width in individual and/or multiple SRAM cells. The trenches 66 in the photoresist 64 are defined by a photomask that is used in the lithography process that patterns the photoresist 64, and hence, an exposure pattern of the photomask has patterns that correspond to the varying width of the trenches 66 in the photoresist 64. As illustrated in FIG. 7A, the trenches 66 have a first width 66w1 and a second width 66w2. The second width 66w2 is greater than the first width 66w1. The first width 66w1 of the trenches 66 can be equal to the width 62w of the trenches 62 formed with respect to FIG. 5A. The second width 66w2 is at a location along each trench 66 where a conductive feature having a small lateral length (e.g., in or parallel to the cross section X-X) is to be formed, and the first width 66w1 is along a remainder of the respective trench 66. In some examples, the conductive feature(s) has the smallest lateral length of the conductive features to be formed contacting the FinFET structures of the respective SRAM cell. In some examples, the conductive feature(s) that is to be formed based on the second width 66w2 of the trench 66 is a bit line or complementary bit line contact. The width of the trenches 66 will substantially define lateral boundaries of openings (e.g., boundaries that intersect a cross-section parallel to the cross-section Y-Y) that are to be formed to various components of the FinFET structures. The first width 66w1 of the trenches 66, in some examples, is in a range from about 10 nm to about 15 nm, and the second width 66w2 is in a range from about 10.5 nm to about 17 nm. The second width 66w2 can be greater than the first width 66w1 by, for example, at least about 0.5 nm, such as about 0.5 nm to about 2 nm.

The second sub-layer 52 that is exposed through the trenches 66 is etched. The etch process can be an anisotropic etch, such as a RIE or another etch process, that selectively etches the second sub-layer 52 without significantly etching the cut portions 54c or the first sub-layer 50. Hence, as illustrated in FIG. 7A, the cut portions 54c act as a mask for the portions of the second sub-layer 52 on which the cut portions 54c are disposed. As a result, after the etch process, cut portions 54c and the first sub-layer 50 are exposed through the trenches 66 of the photoresist 64.

Figure 8A:
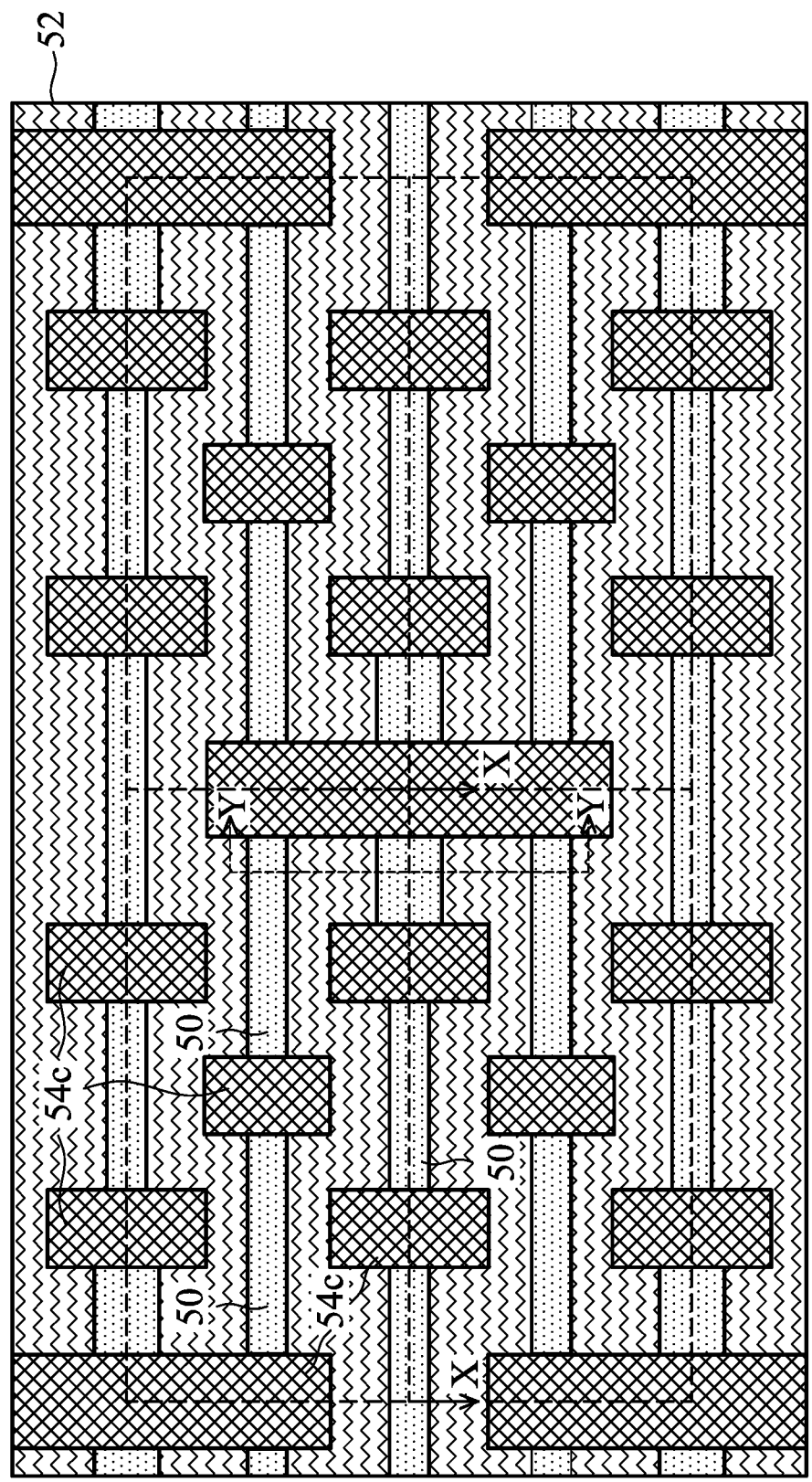

FIGS. 8A, 8B, and 8C illustrate the removal of the photoresist 64. The photoresist 64 can be removed by an ashing or wet strip processes, for example. As a result of the lithography and etch processes of FIGS. 7A-7C, openings are formed through the second sub-layer 52 to expose the first sub-layer 50. The openings through the second sub-layer 52 formed in FIGS. 7A-7C have lateral lengths that are defined by the cut portions 54c and respective widths corresponding to the first width 66w1 and second width 66w2 of the trenches 66.

Figure 9A:
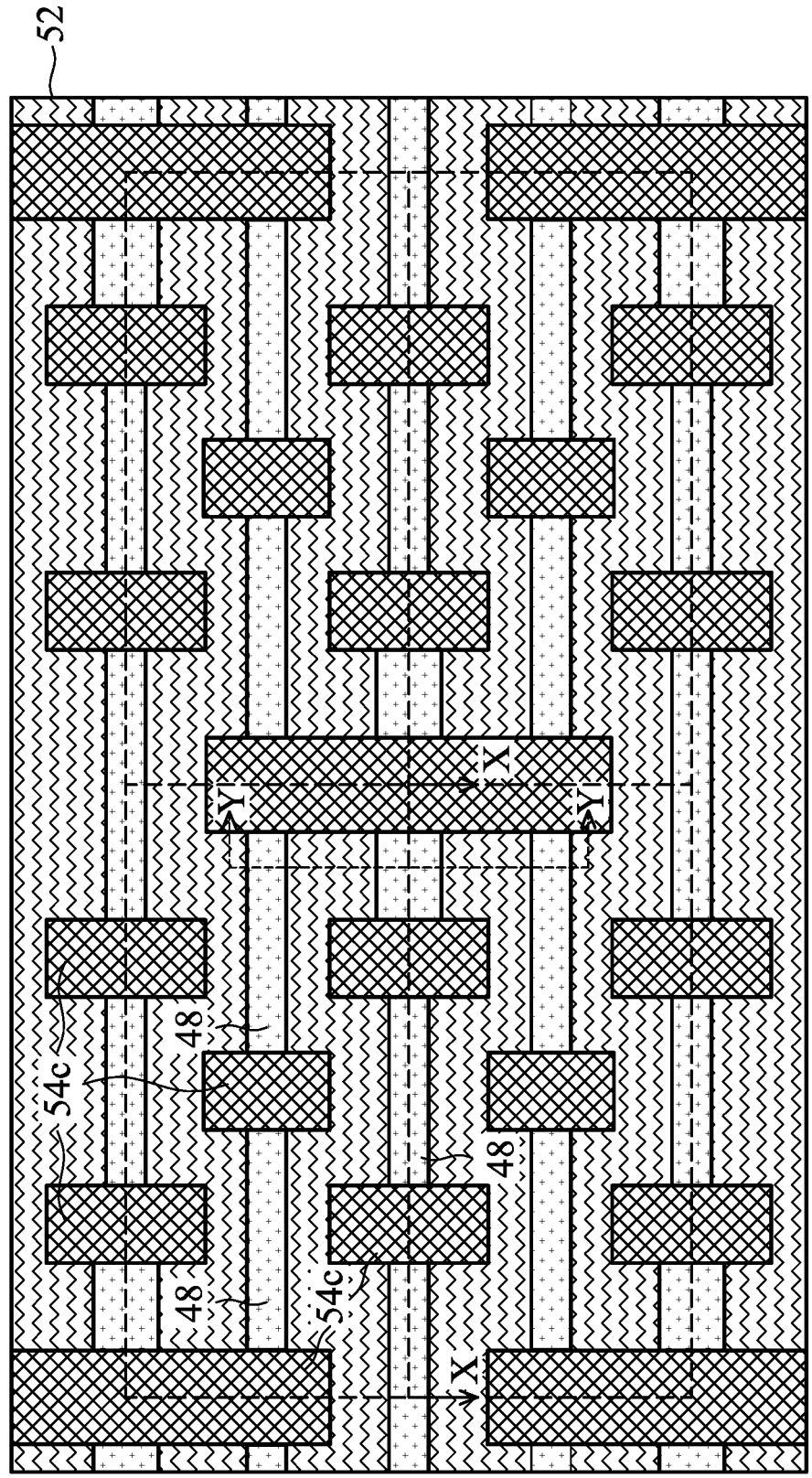

FIGS. 9A, 9B, and 9C illustrate transferring the pattern of the second sub-layer 52 to the first sub-layer 50. The pattern of the second sub-layer 52 can be transferred to the first sub-layer 50 by an etch process. The etch process can be an anisotropic etch, such as a RIE, an ICP etch, or another etch process. The etch process can selectively etch the first sub-layer 50. Although FIGS. 9A, 9B, and 9C illustrate the cut portions 54c and the exposed portions of the second sub-layer 52 partially consumed, the cut portions 54c and the second sub-layer 52 can be removed by and/or remain through the transferring of the pattern and through some subsequent processing before being removed. In some examples, the transferring of the pattern can consume some or all of the cut portions 54c and the second sub-layer 52, and/or a wet clean process (e.g., ammonium hydroxide ($NH_4OH$) and/or diluted hydrofluoric acid (dHF)) can remove the cut portions 54c (e.g., if the cut portions 54c are silicon) and the second sub-layer 52 (e.g., if the second sub-layer 52 is silicon oxide) after the transfer of the pattern to the first sub-layer 50. Transferring the pattern to the first sub-layer 50 forms openings through the first sub-layer 50, corresponding to the openings through the second sub-layer 52, that expose the underlying second ILD 48.

Figure 10A:
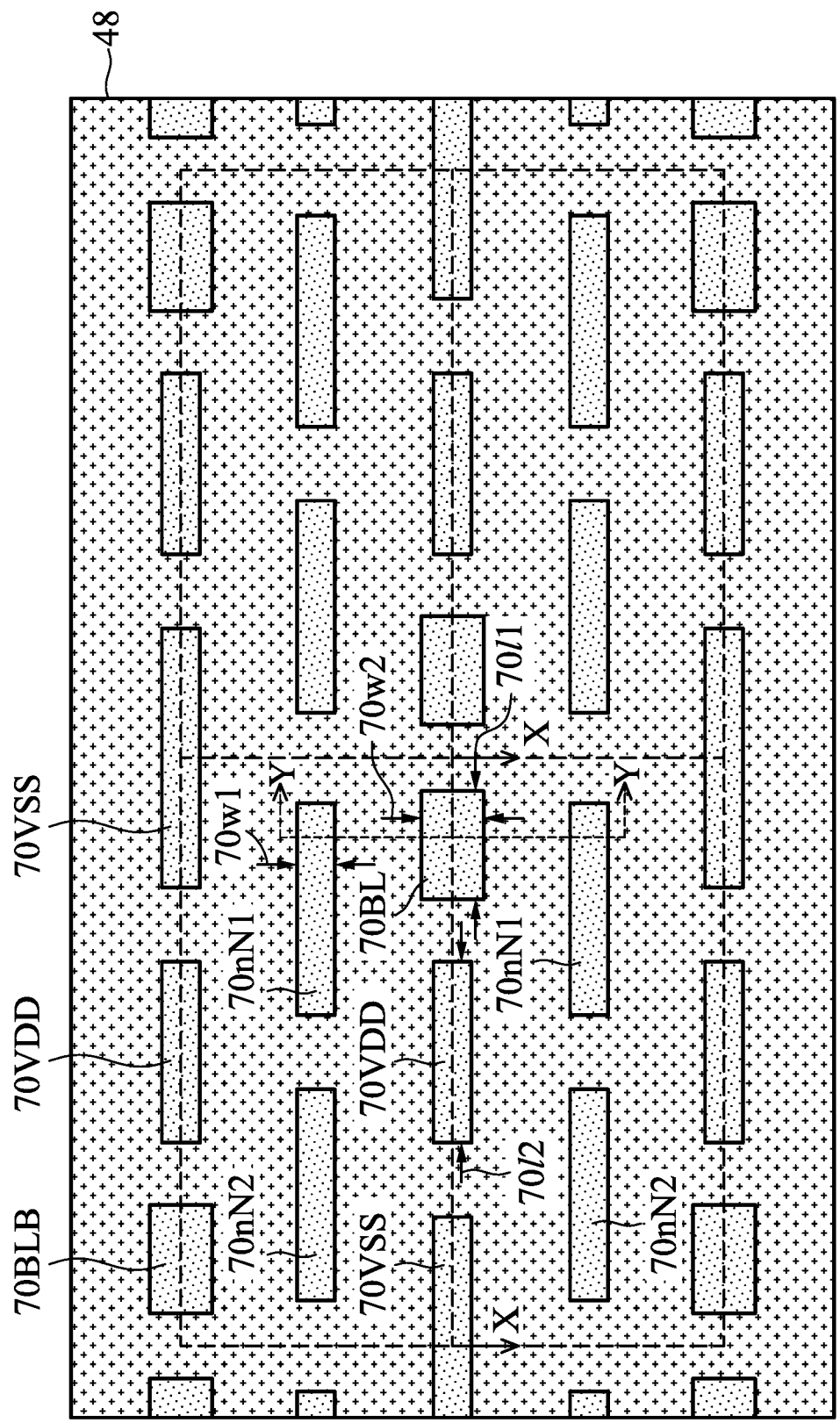

FIGS. 10A, 10B, and 10C illustrate the formation of conductive features (generically, conductive features 70) to respective epitaxial source/drain structures 28. Using the patterned first sub-layer 50 as a mask, openings are etched through the second ILD 48, first ILD 32, and CESL 30 to expose respective epitaxial source/drain structures 28. The openings can be formed by using an etch process, such as atomic layer etch (ALE), RIE, ICP etch, or another etch process. After the formation of the openings, conductive features 70 are formed in the openings to the epitaxial source/drain structures 28. The conductive features 70 may include a silicide region 72 formed on the epitaxial source/drain structures 28, an adhesion and/or barrier layer 74, and a conductive fill material 76 on the adhesion and/or barrier layer 74, as illustrated in FIGS. 10B and 10C. The silicide region 72 may be formed by thermally reacting an upper portion of the epitaxial source/drain structures 28 with a metal layer (not shown), such as titanium, tantalum, or the like, formed on the epitaxial source/drain structures 28. The adhesion and/or barrier layer 74 is conformally deposited in the openings. The adhesion and/or barrier layer 74 may be or include titanium nitride, titanium oxide, tantalum nitride, tantalum oxide, any suitable transition metal nitrides or oxides, the like, or any combination thereof, and may be deposited by any suitable deposition technique. The conductive fill 76 material may be or include cobalt, tungsten, copper, ruthenium, aluminum, gold, silver, alloys thereof, the like, or a combination thereof, and may be deposited by any suitable deposition technique. After the conductive material 76 is deposited, excess conductive fill material 76, adhesion and/or barrier layer 74, and any remaining tri-layer mask may be removed by using a planarization process, such as a CMP. The conductive features 70 may be referred to as contacts, plugs, etc.

More specifically, first power node conductive features 70VDD, second power node conductive features 70VSS, bit line conductive features 70BL, complementary bit line conductive features 70BLB, first intra-cell conductive features 70nN1, and second intra-cell conductive features 70nN2 are formed. A person having ordinary skill in the art will readily understand the correspondence of these conductive features 70 with the SRAM cells 100a-d in the layout of FIG. 2. The bit line conductive features 70BL and complementary bit line conductive features 70BLB have a width 70w2 and a length 70/1. Other conductive features 70 have a width 70w1. As an example, the first power node conductive features 70VDD have a length 70/2.

The width 70w1 corresponds to the widths 62w and 66w1 of the trenches 62 and 66, respectively. The widths 70w2 of the conductive features 70BL and 70BLB correspond to the second width 66w2 of the trenches 66. As a result, the widths 70w2 of the conductive features 70BL and 70BLB are greater than the widths 70w1 of other conductive features 70. In some examples, the width 70w2 of each of the conductive features 70BL and 70BLB is in a range from about 15.5 nm to about 22 nm, and the width 70w1 of each of the other conductive features 70 is in a range from about 15 nm to about 20 nm. The width 70w2 can be greater than the width 70w1 by about 0.5 nm or more, such as by an amount in a range from about 0.5 nm to about 2 nm.

The lengths of the conductive features 70 correspond to the respective spacing between neighboring cut portions 54c disposed along respective trenches 62 and 66. The lengths of the conductive features 70 can vary. The lengths 70/1 of the conductive features 70BL and 70BLB are less than the lengths of other conductive features 70 (e.g., such as the length 70/2 of the first power node conductive features 70VDD). In some examples, the length 70l1 of the conductive features 70BL and 70BLB is in a range from about 30 nm to about 60 nm. The length 70l2 of the conductive features 70VDD can be in a range from about 70 nm to about 100 nm. The length of the conductive features 70N1 and 70N2 can be in a range from about 90 nm to about 120 nm. The length of the conductive features 70VSS can be in a range from about 110 nm to about 140 nm. The length 70l1 of each of the conductive features 70BL and 70BLB can be less than the lengths of each of the other conductive features 70 by an amount in a range from about 20 nm to about 90 nm.

FIGS. 11A-11C through 16A-16C illustrate views of respective intermediate structures at respective stages during another example process for forming an SRAM structure in accordance with some embodiments. The process proceeds as described above with respect to FIGS. 3A-3C through 6A-6C. The process then proceeds to FIGS. 11A-11C as described below.

Similar to above, the process including FIGS. 5A-5C through 6A-6C and 11A-11C through 12A-12C illustrate double patterning using a lithography-etch-lithography-etch (LELE) process. The order of the lithography-etch processes can be altered from what is described herein. As described herein, a first lithography-etch process is performed with respect to FIGS. 5A-5C and 6A-6C, and a second, subsequent lithography-etch process is performed with respect to FIGS. 11A-11C and 12A-12C. In other examples, the lithography-etch process of FIGS. 11A-11C and 12A-12C is performed before the lithography-etch process of FIGS. 5A-5C and 6A-6C. In other examples, single patterning processes may be implemented, or other double patterning processes (or more patterning) may be implemented.

Various etch processes are described in the following processing. An opening-widening etch process is described as being performed after a described etch process below to provide an example. In other examples, various other etch processes implemented to form the opening (such as etch processes that pattern the tri-layer mask and that etch through the second ILD 48 and first ILD 32) may implement an opening-widening etch process. In other examples, the opening-widening etch process may be performed between any of the various etch processes and/or in the place of an anisotropic etch process that is one of the various etch processes. Further details will be described below.

Figure 11A:
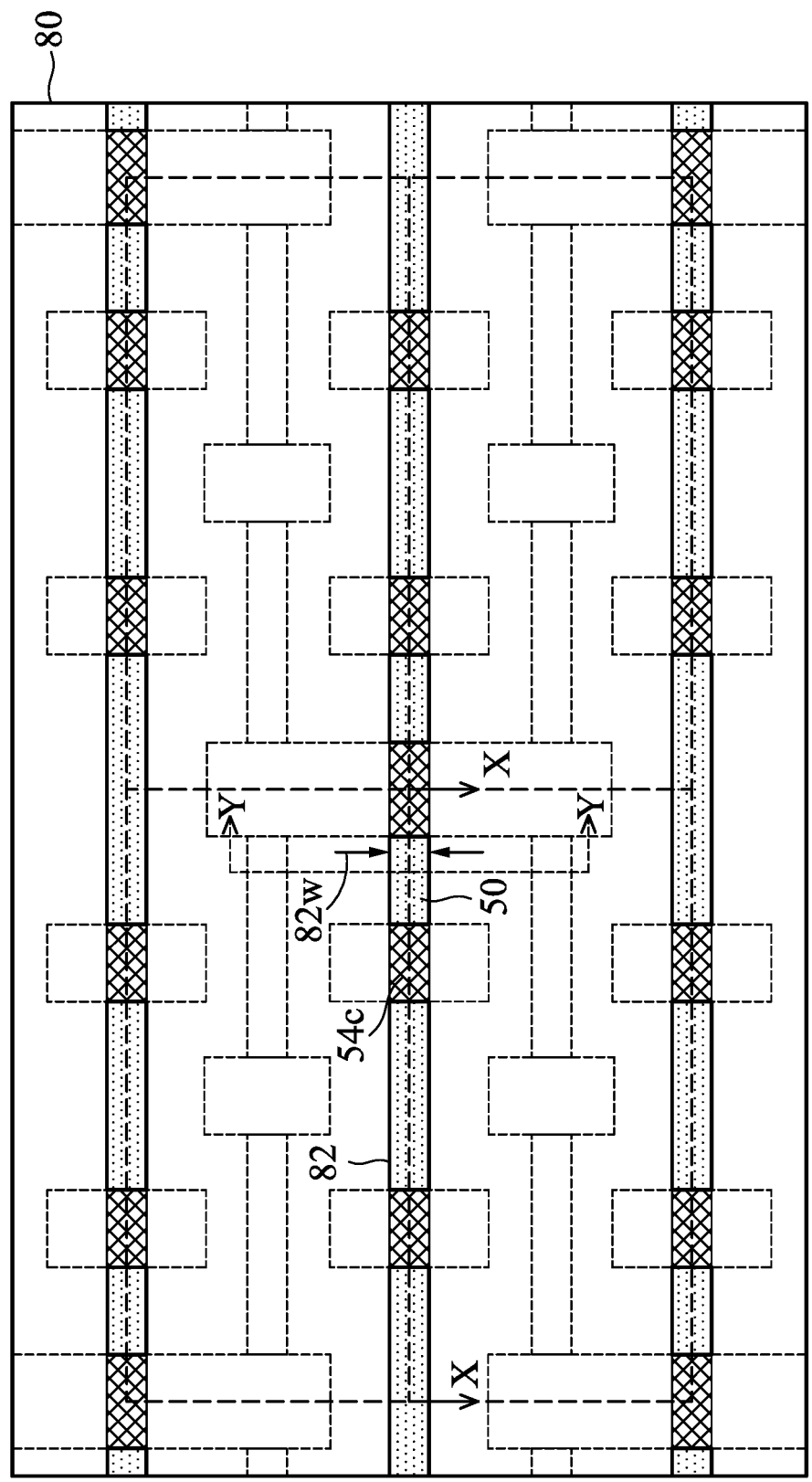

FIGS. 11A, 11B, and 11C illustrate the formation of a photoresist 80 with trenches 82 and the subsequent etching of the second sub-layer 52 through the trenches 82. The photoresist 80 can be formed on the cut portions 54c, the second sub-layer 52, and first sub-layer 50, such as by using spin-on coating, and patterned to have the trenches 82 by exposing the photoresist 80 to light using an appropriate photomask. Exposed or unexposed portions of the photoresist 80 may then be removed depending on whether a positive or negative resist is used. Each of trenches 82 of the photoresist 80 can be disposed between where respective neighboring pairs of the trenches 82 of the photoresist 60 where formed as described above with respect to FIGS. 5A-5C. Each of the trenches 82 can extend across multiple SRAM cells. Each of the trenches 82 can have a substantially uniform width 82w across individual and multiple SRAM cells. The trenches 82 in the photoresist 80 are defined by a photomask that is used in the lithography process that patterns the photoresist 80, and hence, an exposure pattern of the photomask has patterns that correspond to the substantially uniform width 82w of the trenches 82 in the photoresist 80. The width 82w of the trenches 82 will substantially define lateral boundaries of at least some of the openings (e.g., boundaries that intersect a cross-section parallel to the cross-section Y-Y) that are to be formed to various components of the FinFET structures. The width 82w of the trenches 82 can be equal to the width 62w of the trenches 62 formed with respect to FIG. 5A. A width 82w of the trenches 82, in some examples, is in a range from about 40 nm to about 60 nm.

The second sub-layer 52 that is exposed through the trenches 82 is etched. The etch process can be an anisotropic etch, such as a RIE, an ICP etch, or another etch process, that selectively etches the second sub-layer 52 without significantly etching the cut portions 54c or the first sub-layer 50. Hence, as illustrated in FIG. 11A, the cut portions 54c act as a mask for the portions of the second sub-layer 52 on which the cut portions 54c are disposed. As a result, after the etch process, cut portions 54c and the first sub-layer 50 are exposed through the trenches 82 of the photoresist 80.

Figure 12A:
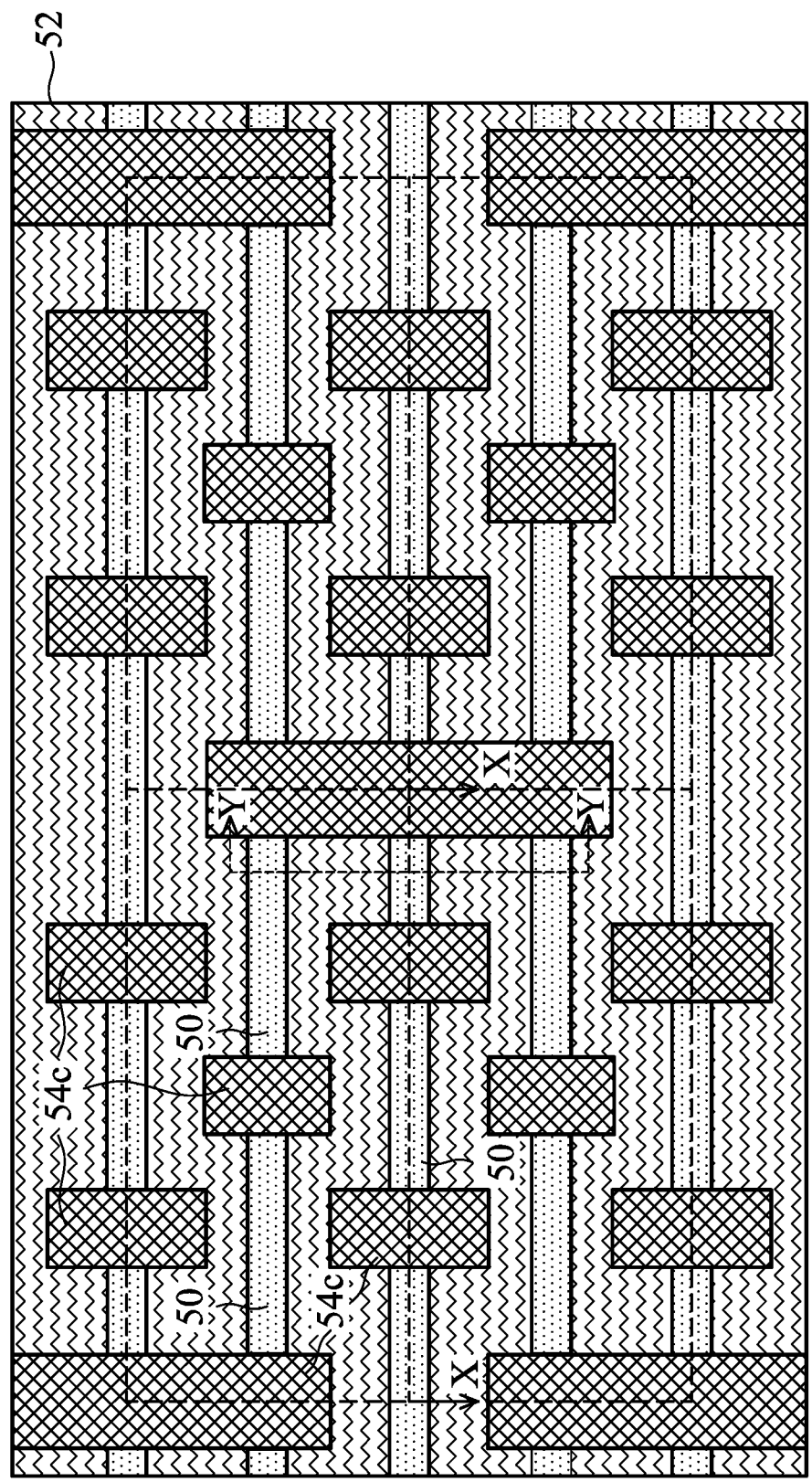

FIGS. 12A, 12B, and 12C illustrate the removal of the photoresist 80. The photoresist 80 can be removed by an ashing or wet strip processes, for example. As a result of the lithography and etch processes of FIGS. 11A-11C, openings are formed through the second sub-layer 52 to expose the first sub-layer 50. The openings through the second sub-layer 52 formed in FIGS. 11A-11C have lateral lengths that are defined by the cut portions 54c and widths corresponding to the width 82w of the trenches 82.

Figure 13A:
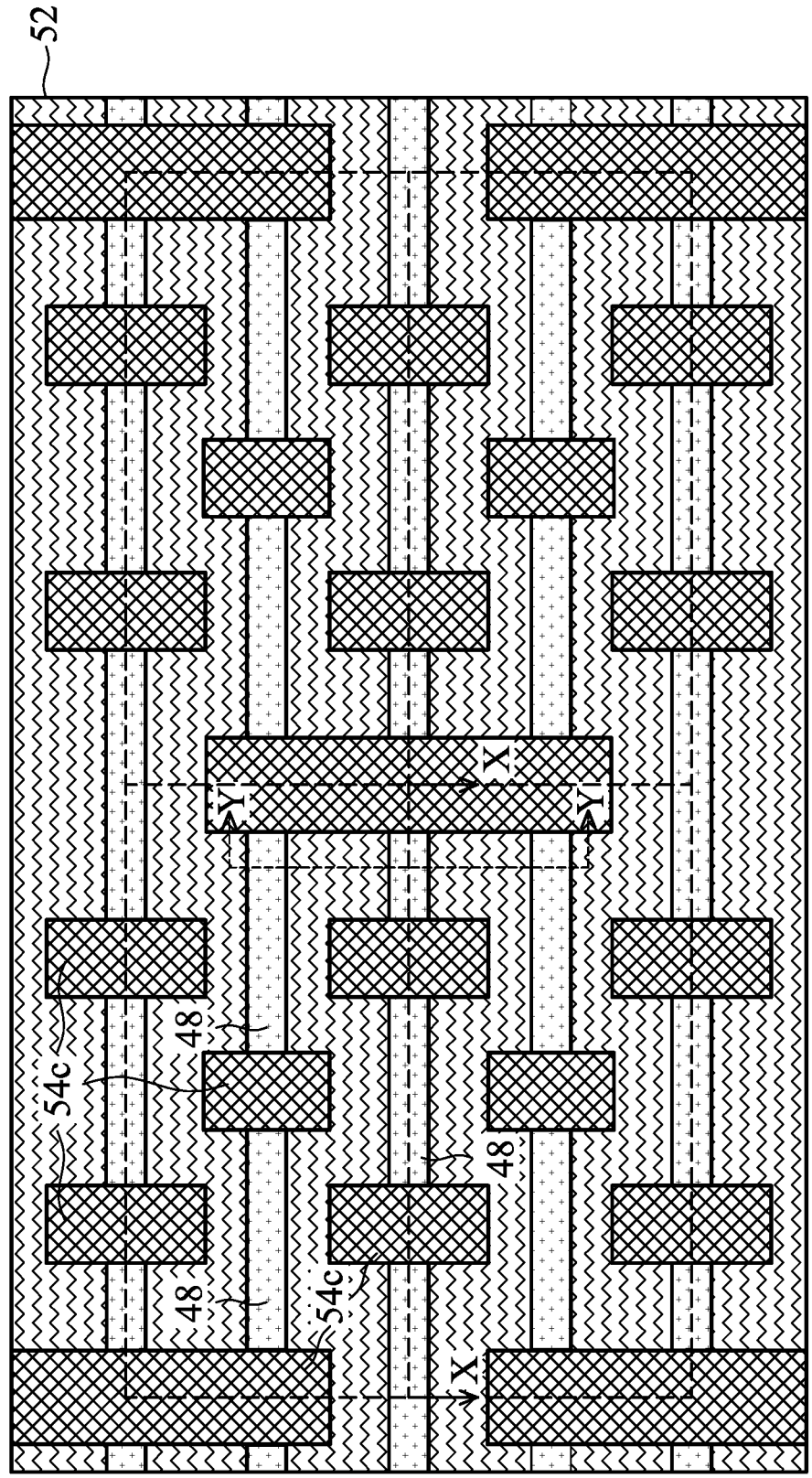

FIGS. 13A, 13B, and 13C illustrate transferring the pattern of the second sub-layer 52 to the first sub-layer 50. The pattern of the second sub-layer 52 can be transferred to the first sub-layer 50 by an etch process. The etch process can be an anisotropic etch, such as a RIE, an ICP etch, or another etch process. The etch process can selectively etch the first sub-layer 50. Although FIGS. 13A, 13B, and 13C illustrate the cut portions 54c and the exposed portions of the second sub-layer 52 partially consumed, the cut portions 54c and the second sub-layer 52 can be removed by and/or remain through the transferring of the pattern and through some subsequent processing before being removed. In some examples, the transferring of the pattern can consume some or all of the cut portions 54c and the second sub-layer 52, and/or a wet clean process can remove the cut portions 54c and the second sub-layer 52 after the transfer of the pattern to the first sub-layer 50. Transferring the pattern to the first sub-layer 50 forms openings through the first sub-layer 50, corresponding to the openings through the second sub-layer 52, that expose the underlying second ILD 48.

Figure 14A:
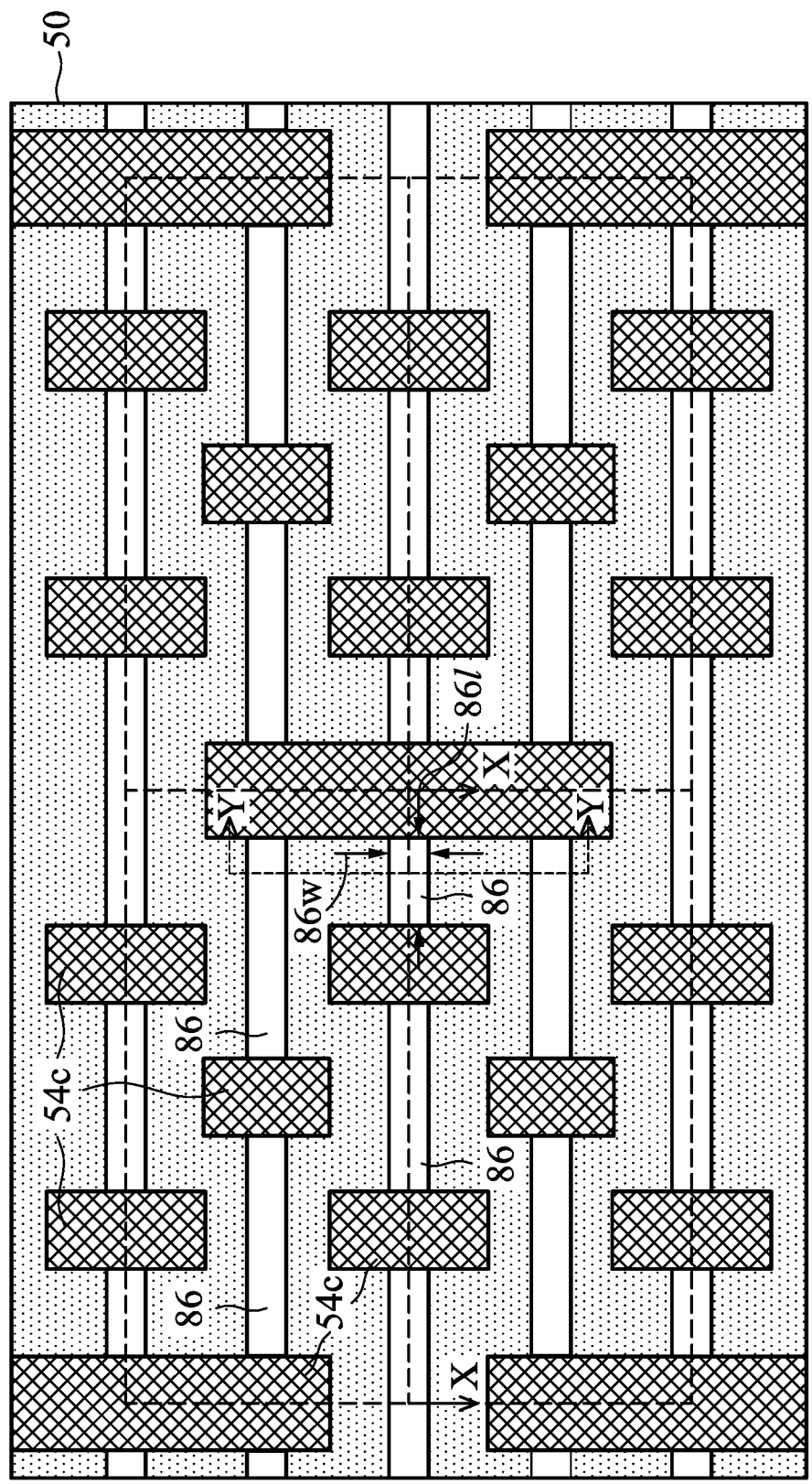

FIGS. 14A, 14B, and 14C illustrate the formation of openings 86 through the second ILD 48 and first ILD 32. In the illustrated example, the openings 86 are formed to the CESL 30, but in other examples, the openings 86 may expose the epitaxial source/drain structures 28 or be to various other depths in the first ILD 32. The openings 86 can be formed by using an etch process, such as ALE, RIE, ICP etch, or another etch process. As illustrated, some of the cut portions 54c are partially consumed and exposed portions of the second sub-layer 52 are removed by the etch process, although other examples may consume or remove these portions differently. The openings 86 have a width 86w corresponding to the widths 62w and 82w of the trenches 62 and 82, respectively. One of the openings 86 is at a location where a conductive feature having a small lateral length (e.g., in or parallel to the cross section X-X) is to be formed, and that opening 86 has a length 86l. In some examples, the conductive feature(s) has the smallest lateral length of the conductive features to be formed contacting the FinFET structures of the respective SRAM cell. In some examples, the conductive feature(s) that is to be formed based on the length 86l is a bit line or complementary bit line contact.

Figure 15A:
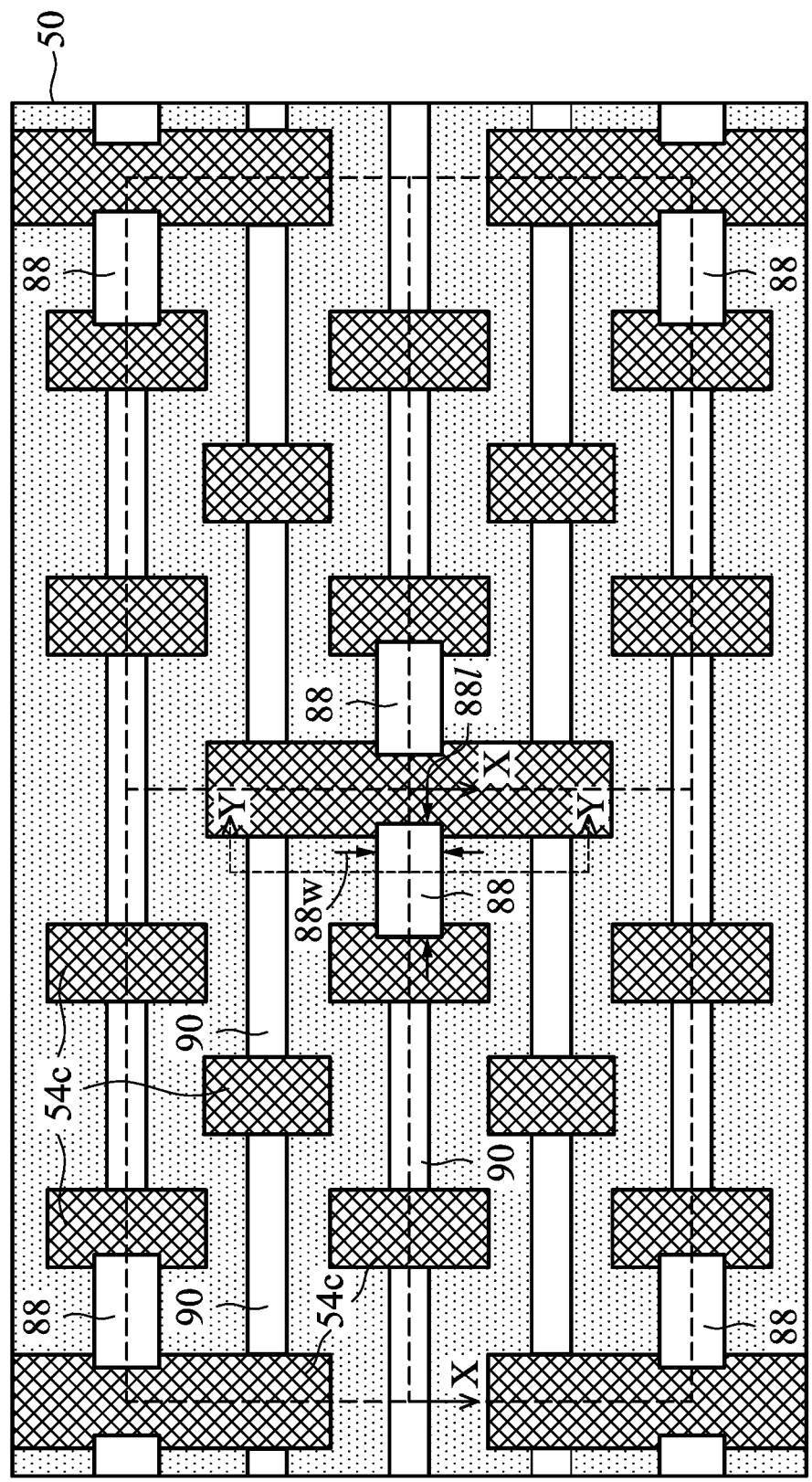
Figures 15B, 15C:
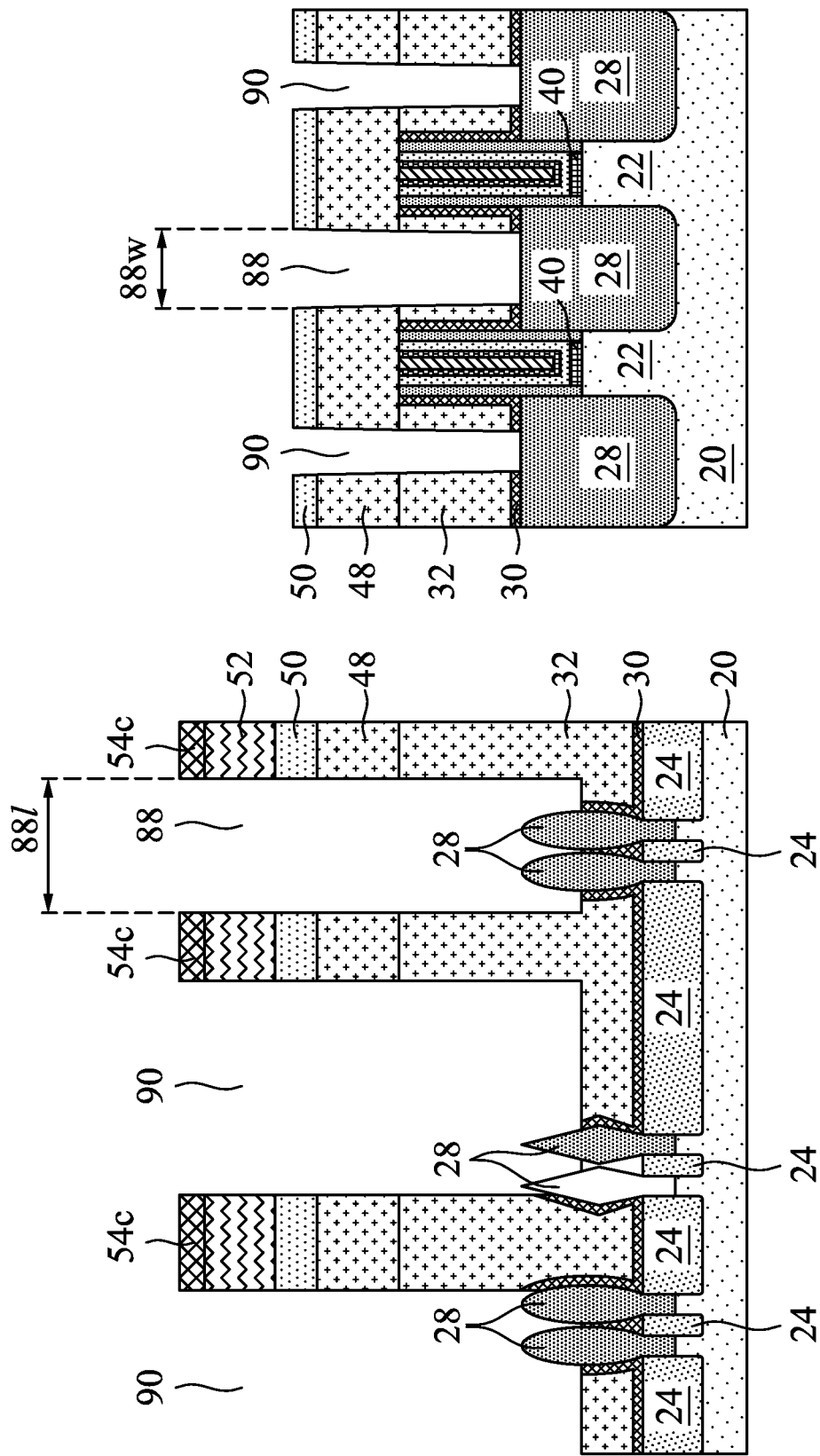

FIGS. 15A, 15B, and 15C illustrate the widening of the openings at the locations where conductive features having a small lateral length are to be formed. The openings 86 at those locations are widened to openings 88. The remainder of openings 86 may or may not be significantly widened and are referred to as openings 90.

The openings 88 are widened by an opening-widening etch process. The opening-widening etch process can leverage characteristics of the loading effect to widen smaller openings while not significantly widening larger openings. In some examples, the opening-widening etch process includes an etchant gas and a polymer-passivating gas, and a ratio of the etchant gas to the polymer-passivating gas is tuned to implement the opening-widening etch process. In some examples, a substrate bias and/or a plasma generator source can be pulsed during an etch process to implement the opening-widening etch process. In some examples, the ratio of gases and pulsing can be implemented.

In some examples, the ratio of the etchant gas to the polymer-passivating gas is tuned. An inductively coupled plasma reactive ion etching (ICP-RIE) process may be implemented. The ICP-RIE can use a carbon-poor fluorine-based etchant gas (such as $CF_4$, $NF_3$, etc.) or another etchant gas, and can use a carbon-rich polymer-passivating gas (such as $CHF_3$, $CH_2F_2$, $CH_3F$, $C_4F_6$, $C_4F_8$, etc.) or another polymer gas. A flow rate of the etchant gas can be in a range from about 100 sccm to about 500 sccm, and a flow rate of the polymer-passivating gas can be in a range from about 5 sccm to about 50 sccm. In some examples, a ratio of the flow rate of the etchant gas to the flow rate of the polymer-passivating gas is in a range from about 2 to about 100. A pressure of the ICP-RIE can be in a range from about 10 mTorr to about 100 mTorr. A temperature of the ICP-RIE can be in a range from about 40° C. to about 150° C. The plasma generator of the ICP-RIE can be at a power in a range from about 100 W to about 1,000 W, and the substrate holder can be biased to a voltage in a range from about 50 V to about 900 V.

In these examples, the ratio of the flow rates is tuned to permit more etching in smaller openings than in larger openings. A reactant (e.g., cation and/or radical) from the polymer-passivating gas can diffuse less into smaller openings than in larger openings, which can result in less passivation in the smaller openings than in the larger openings. Similarly, a reactant (e.g., cation and/or radical) from the etchant gas can diffuse less into smaller openings than in larger openings, which can result in less etching of the smaller openings than the larger openings. The effects of these reactants can be tuned by tuning the ratio of the flow rates of the gases such that the smaller openings can have more lateral etching than the larger openings. Even though less reactants from the etchant gas can diffuse into a smaller opening than a larger opening, the etch rate in the smaller opening can be greater than in the larger opening because more reactants from the polymer-passivating gas can diffuse into the larger opening (and therefore block the reactants from the etchant gas from etching the underlying material) than the smaller opening. Various gases and ratios can be implemented based on the materials being etched as well as the sizes of the various openings.

In some examples, the substrate bias and/or a plasma generator source is pulsed. An ICP-RIE process may be implemented. The ICP-RIE can use a fluorine-based etchant gas (such as $CF_4$, $NF_3$, etc.) or another etchant gas. A flow rate of the etchant gas can be in a range from about 100 sccm to about 500 sccm, and can use a passivating gas (such as $CHF_3$, $CH_2F_2$, $CH_3F$, $C_4F_6$, $C_4F_8$, etc.). A pressure of the ICP-RIE can be in a range from about 10 mTorr to about 100 mTorr. A temperature of the ICP-RIE can be in a range from about 40° C. to about 150° C. The plasma generator of the ICP-RIE can be at a power in a range from about 100 W to about 1,000 W, and the substrate holder can be biased to a voltage in a range from about 50 V to about 900 V. The power of the plasma generator and the bias voltage of the substrate holder can be pulsed such that when one is pulsed on (or high) the other is off (or low). The bias voltage of the substrate holder can be pulsed with a square wave pulse with a duty cycle in a range from about 10% to about 90% and at a frequency in a range from about 10 Hz to about 10 kHz. The power of the plasma generator can also be pulsed with a square wave pulse with a duty cycle in a range from about 10% to about 90% and at a frequency in a range from about 10 Hz to about 10 kHz. The pulsed plasma generator and pulsed bias voltage of the substrate can be synchronous or non-synchronous.

Figure 17:
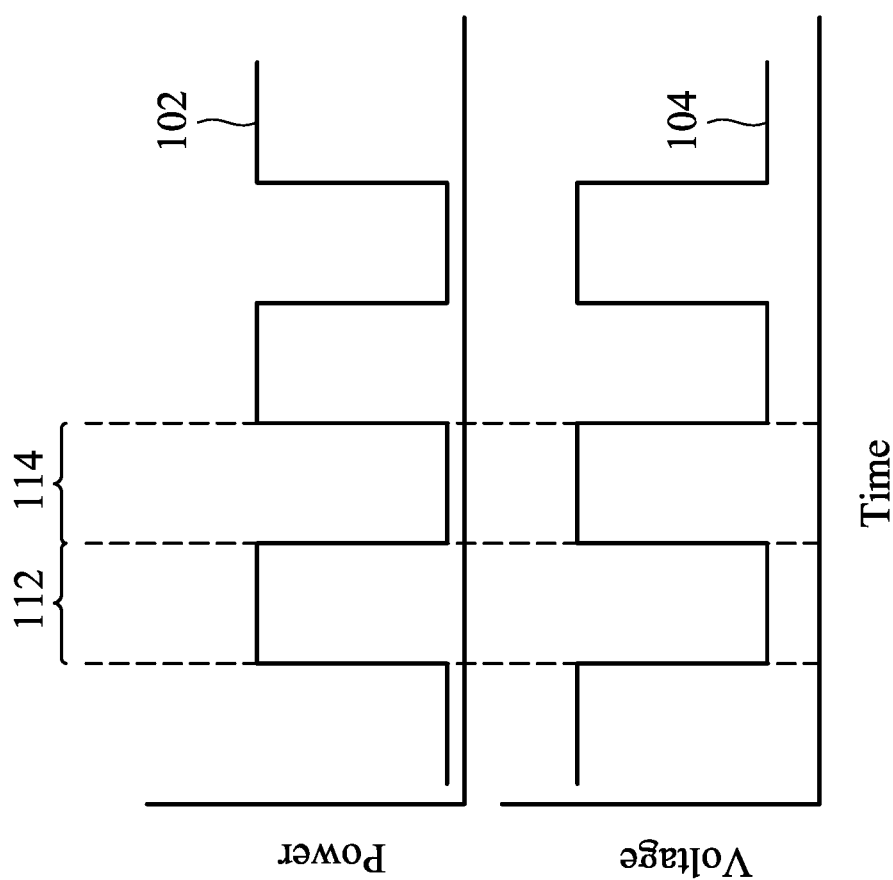
FIG. 17 is a graph illustrating pulsing of power of a plasma generator and a bias voltage of a substrate holder during an opening-widening etch process in accordance with some embodiments.

In these examples, pulsing is tuned to permit more etching in smaller openings than in larger openings. Referring to FIG. 17, pulsing function 102 illustrates an example pulsing of the power of the plasma generator, and pulsing function 104 illustrates an example pulsing of the bias voltage of the substrate holder. During a first time period 112 when the power of the plasma generator is pulsed high and the bias voltage of the substrate holder is low, etching substantially does not occur, and etch by-product dissociation occurs. During a second time period 114 when the bias voltage of the substrate holder is pulsed high and the power of the plasma generator is low, ions are accelerated causing etching to occur, and etch by-product dissociation does not occur. When the bias voltage of the substrate holder is pulsed on, the process is etch dominated, and when the bias voltage of the substrate is low, the process is passivation dominated. During the periods when the bias voltage is low (e.g., off), more passivation may occur in the large openings than in the smaller openings. During periods when the bias voltage is pulsed on (and/or when the power of the plasma generator is low), greater etching occurs in the larger openings than in the smaller openings. The effects of these reactants can be tuned by tuning the pulse of the plasma generator and/or bias voltage of the substrate to achieve a ratio therebetween that can have more lateral etching in smaller openings than in the larger openings.

In some examples, aspects of tuning a ratio of the gases and pulsing can be implemented. In an example, an ICP-RIE is implemented. The ICP-RIE can use a carbon-poor fluorine-based etchant gas (such as $CF_4$, $NF_3$, etc.) or another etchant gas, and can use a carbon-rich polymer-passivating gas (such as $CHF_3$, $CH_2F_2$, $CH_3F$, $C_4F_6$, $C_4F_8$, etc.) or another polymer gas. A flow rate of the etchant gas can be in a range from about 100 sccm to about 500 sccm, and a flow rate of the polymer-passivating gas can be in a range from about 5 sccm to about 50 sccm. In some examples, a ratio of the flow rate of the etchant gas to the flow rate of the polymer-passivating gas is in a range from about 2 to about 100. A pressure of the ICP-RIE can be in a range from about 10 mTorr to about 100 mTorr. A temperature of the ICP-RIE can be in a range from about 40° C. to about 150° C. The plasma generator of the ICP-RIE can be at a power in a range from about 100 W to about 1,000 W, and the substrate holder can be biased to a voltage in a range from about 50 V to about 900 V. The power of the plasma generator and the bias voltage of the substrate holder can be pulsed such that when one is pulsed on (or high) the other is off (or low). The bias voltage of the substrate holder can be pulsed with a square wave pulse with a duty cycle in a range from about 10% to about 90% and at a frequency in a range from about 10 Hz to about 10 kHz. The power of the plasma generator can also be pulsed with a square wave pulse with a duty cycle in a range from about 10% to about 90% and at a frequency in a range from about 10 Hz to about 10 kHz. The pulsed plasma generator and pulsed bias voltage of the substrate can be synchronous or non-synchronous.

FIGS. 15A, 15B, and 15C further illustrate a width $88w$ and a length $88l$ of the opening 88 that is widened by the opening-widening etch process. In some examples, the width $88w$ can be in a range from about 15 nm to about 25 nm, and the length $88l$ can be in a range from about 30 nm to about 60 nm. The width $88w$ can be an increase from the width $86w$ by an amount in a range from about 0.5 nm to about 2 nm, and the length $88l$ can be an increase from the length $86l$ by an amount in a range from about 0.5 nm to about 3 nm.

As indicated previously, the opening-widening etch process may be performed at different instances during processing. In some examples, the opening-widening etch process may be performed as the etch process that patterns the second sub-layer 52 in FIGS. 11A-11C, or after the etch process that patterns the second sub-layer 52 in FIGS. 11A-11C but before the etch process that patterns the first sub-layer 50 in FIGS. 13A-13C. In some examples, the opening-widening etch process may be performed as the etch process that patterns the first sub-layer 50 in FIGS. 13A-13C, or after the etch process that patterns the first sub-layer 50 in FIGS. 13A-13C but before the etch process that forms the openings 86 in FIGS. 14A-14C. In some examples, the opening-widening etch process may be performed as the etch process that forms the openings 86 in FIGS. 14A-14C. Various combinations or permutations of these etch processes may be implemented.

Figure 16A:
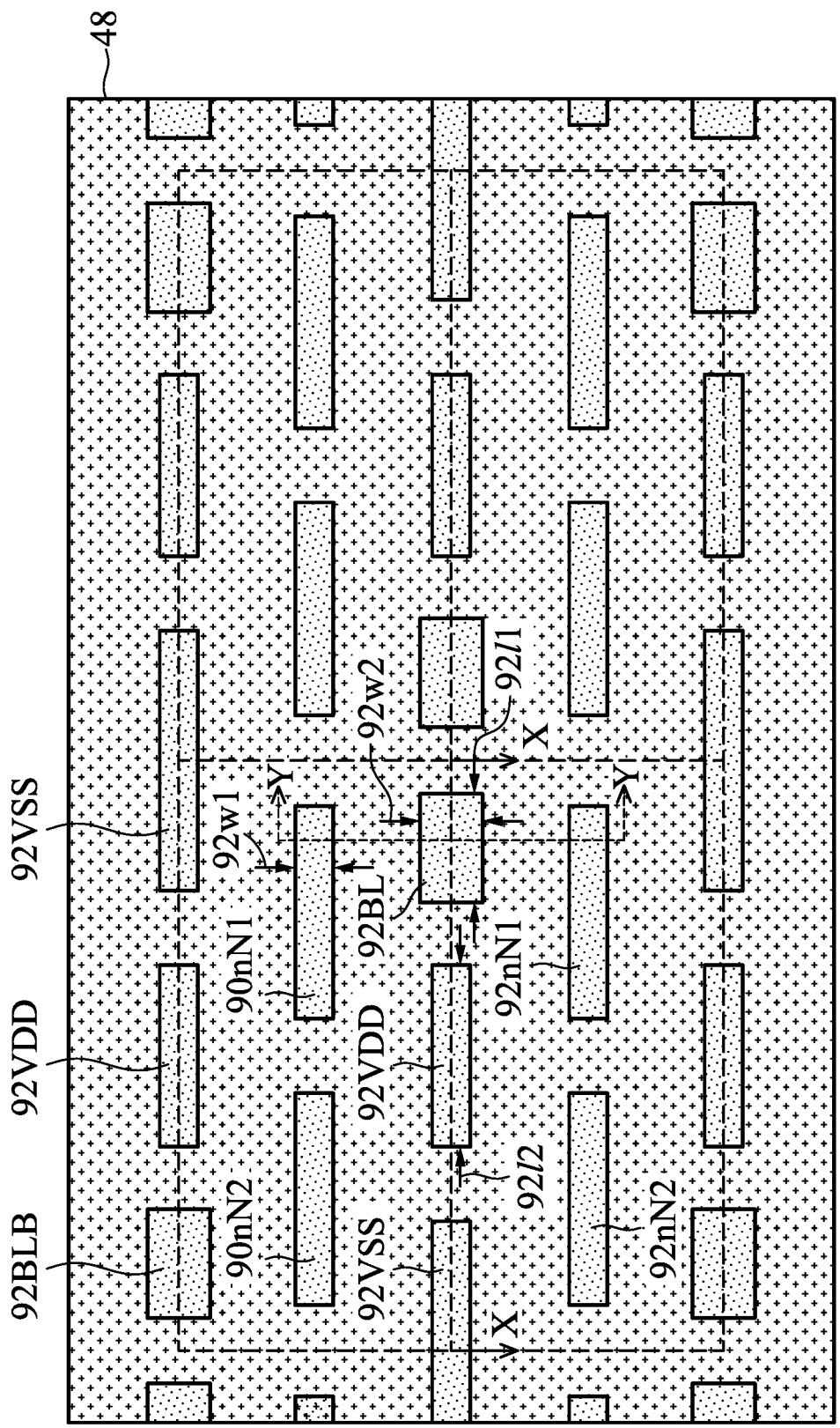
Figures 16B, 16C:
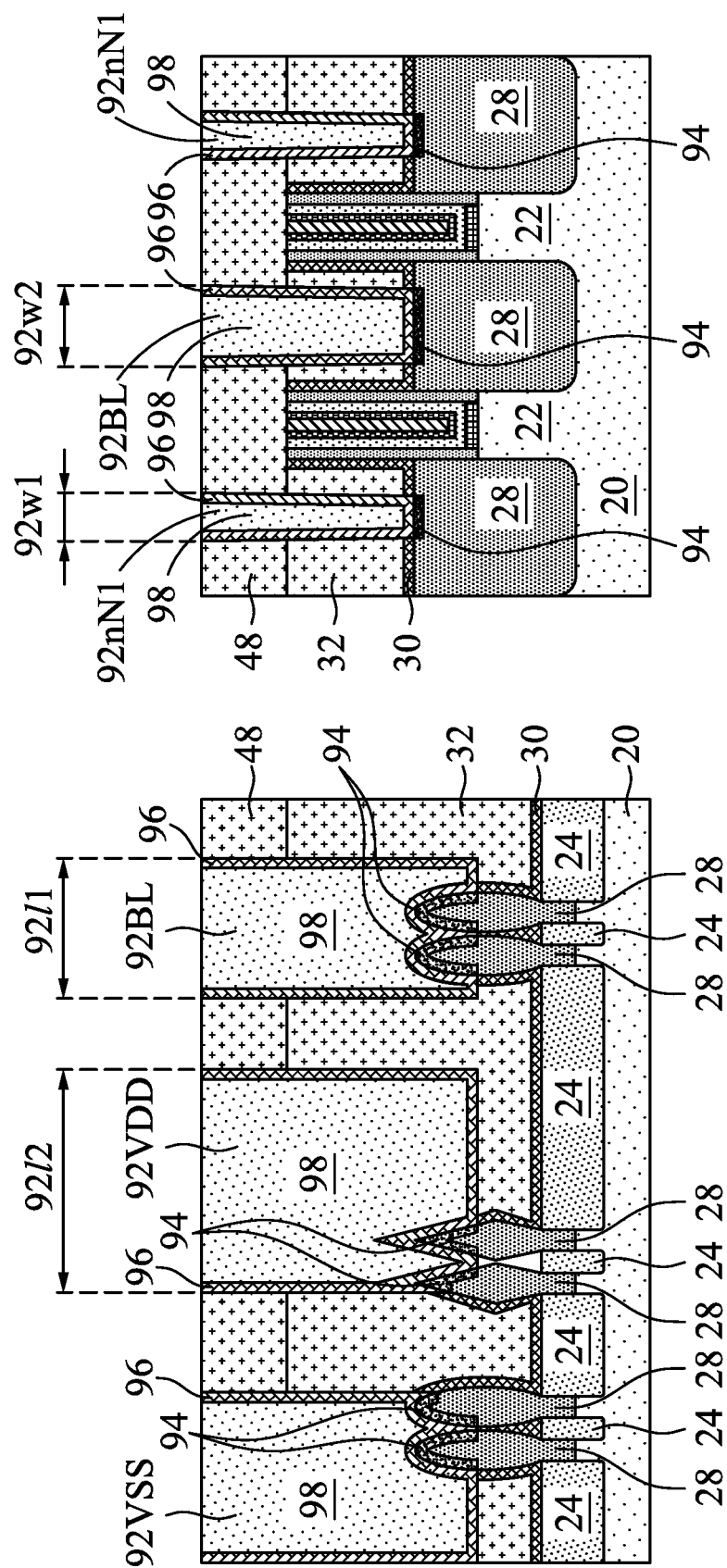

FIGS. 16A, 16B, and 16C illustrate the formation of conductive features (generically, conductive features 92) to respective epitaxial source/drain structures 28. Conductive features 92 are formed in the openings 88 and 90 to the epitaxial source/drain structures 28. The conductive features 92 may include a silicide region 94 formed on the epitaxial source/drain structures 28, an adhesion and/or barrier layer 96, and a conductive fill material 98 on the adhesion and/or barrier layer 96. The conductive features 92 can be formed with the same or similar materials and by the same or similar processed as described above with respect to FIGS. 10A-10C. The conductive features 92 may be referred to as contacts, plugs, etc.

More specifically, first power node conductive features 92VDD, second power node conductive features 92VSS, bit line conductive features 92BL, complementary bit line conductive features 92BLB, first intra-cell conductive features 92nN1, and second intra-cell conductive features 92nN2 are formed. A person having ordinary skill in the art will readily understand the correspondence of these conductive features 92 with the SRAM cells 100a-d in the layout of FIG. 2. The bit line conductive features 92BL and complementary bit line conductive features 92BLB have a width $92w2$ and a length $92l$. Other conductive features 92 have a width $92w1$. As an example, the first power node conductive features 92VDD have a length $92l2$.

The width $92w1$ corresponds to the widths $86w$ of the openings 86. The widths $92w2$ of the conductive features 92BL and 92BLB correspond to the width $88w$ of the openings 88. As a result, the widths $92w2$ of the conductive features 92BL and 92BLB are greater than the widths $92w1$ of other conductive features 92. In some examples, the width $92w2$ of each of the conductive features 92BL and 92BLB is in a range from about 15 nm to about 25 nm, and the width $92w1$ of each of the other conductive features 92 is in a range from about 14.5 nm to about 22 nm. The width $92w2$ can be greater than the width $92w1$ by an amount in a range from about 0.5 nm to about 3 nm.

The lengths of the conductive features 92 substantially correspond to the respective spacing between neighboring cut portions 54c disposed along respective trenches 62 and 82. The lengths of the conductive features 92 can vary. The lengths $92l1$ of the conductive features 92BL and 92BLB can be enlarged from the spacing between respective cut portions 54c and are less than the lengths of other conductive features 92 (e.g., such as the length $92l2$ of the first power node conductive features 92VDD). In some examples, the length $92l1$ of each of the conductive features 92BL and 92BLB is in a range from about 30 nm to about 60 nm. The length $92l1$ of each of the conductive features 92BL and 92BLB can be less than the lengths of each of the other conductive features 92 by an amount in a range from about 20 nm to about 90 nm.

As described previously, some examples can form wider bit line and complementary bit line conductive features by tuning a lithography process, and some examples can form wider bit line and complementary bit line conductive features by tuning an etch process. In other examples, various aspects of these preceding examples can be combined to achieve wider conductive features, such as wider bit line and complementary bit line conductive features.

Embodiments described herein can achieve advantages. By having an increased width of openings that have small lengths, gap fill of the conductive fill material in the openings may be improved. With improved gap fill, the conductive fill material of conductive features (that are formed in the openings with the increased widths and small lengths) can be void free. For example, the bit line conductive features and complementary bit line conductive features in the SRAM layouts described herein may be void free. Further, by increasing the widths of the smaller openings, the widths of larger openings (with larger lengths) can be decreased. By decreasing the widths of the larger openings, a distance between the openings (and hence, the conductive features formed in those openings) can be increased, which increases a processing window and reduces a risk of overlay with gate structures due to misalignment. Various other advantages may be achieved.

An embodiment is a structure. The structure includes a substrate, a dielectric layer over the substrate, a first conductive feature through the dielectric layer to a first source/drain region on the substrate, and a second conductive feature through the dielectric layer to a second source/drain region on the substrate. The first conductive feature has a first length along a longitudinal axis of the first conductive feature and a first width perpendicular to the first length. The second conductive feature has a second length along a longitudinal axis of the second conductive feature and a second width perpendicular to the second length. The longitudinal axis of the first conductive feature is aligned with the longitudinal axis of the second conductive feature. The first width is greater than the second width, and the first length is less than the second length.

Another embodiment is a structure. The structure includes a substrate, a static random access memory (SRAM) structure on the substrate, a dielectric layer over the SRAM structure on the substrate, a bit line contact through the dielectric layer to the SRAM structure, and a first power node contact through the dielectric layer to the SRAM structure. A length of the first power node contact is aligned with a length of the bit line contact. The length of the first power node contact is greater than the length of the bit line contact, and a width of the first power node contact is less than a width of the bit line contact.

A further embodiment is a method. A dielectric layer is deposited on a substrate. A mask is deposited over the dielectric layer. A photoresist is patterned over the mask. The photoresist has a trench. A first mask opening and a second mask opening are etched through the mask. Etching the first mask opening and the second mask opening includes etching the mask through the trench in the photoresist. A first contact opening and a second contact opening are etched through the dielectric layer. Etching the first contact opening and the second contact opening includes etching the dielectric layer through the first mask opening to form the first contact opening and etching the dielectric layer through the second mask opening to form the second contact opening. The first contact opening and second contact opening have respective lengths that are aligned and correspond to a length of the trench in the photoresist. A width of the first contact opening is greater than a width of the second contact opening. The first contact opening and the second contact opening are filled with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a substrate;
   a dielectric layer over the substrate;
   a first conductive feature extending through the dielectric layer to a first source/drain region on the substrate, the first conductive feature having a first length along a longitudinal axis of the first conductive feature and a first width perpendicular to the first length; and
   a second conductive feature extending through the dielectric layer to a second source/drain region on the substrate, the second conductive feature having a second length along a longitudinal axis of the second conductive feature and a second width perpendicular to the second length, the longitudinal axis of the first conductive feature being aligned with the longitudinal axis of the second conductive feature, the first width being greater than the second width, the first length being less than the second length.

2. The structure of claim 1, wherein the first width is greater than the second width by at least 0.5 nm.

3. The structure of claim 1, wherein the first conductive feature is a bit line conductive feature to a static random access memory (SRAM) structure on the substrate.

4. The structure of claim 1, wherein the longitudinal axis of the first conductive feature and the longitudinal axis of the second conductive feature are aligned in a boundary of a static random access memory (SRAM) cell on the substrate.

5. The structure of claim 1, wherein:
   the first conductive feature extends to a source/drain region of a pass-gate transistor of a static random access memory (SRAM) cell on the substrate; and
   the second conductive feature extends to a source/drain region of a pull-up transistor of the SRAM cell.

6. The structure of claim 1, wherein the dielectric layer extends along a bottom surface of the first conductive feature.

7. The structure of claim 1, wherein the dielectric layer extends along a bottom surface of the second conductive feature.

8. A structure comprising:
   a substrate;
   a static random access memory (SRAM) structure on the substrate;
   a dielectric layer over the SRAM structure on the substrate;
   a bit line contact extending through the dielectric layer to the SRAM structure; and
   a first power node contact extending through the dielectric layer to the SRAM structure, a length of the first power node contact being aligned with a length of the bit line contact, the length of the first power node contact being greater than the length of the bit line contact, a width of the first power node contact being less than a width of the bit line contact.

9. The structure of claim 8, wherein the width of the first power node contact is less than the width of the bit line contact by at least 0.5 nm.

10. The structure of claim 8, wherein the length of the first power node contact and the length of the bit line contact are aligned along a boundary of an SRAM cell of the SRAM structure.

11. The structure of claim 8 further comprising:
- a second power node contact extending through the dielectric layer to the SRAM structure, the length of the bit line contact, the length of the first power node contact, and a length of the second power node contact being aligned along a first boundary of an SRAM cell of the SRAM structure, a width of the second power node contact being equal to the width of the first power node contact;
- a complementary bit line contact through the dielectric layer to the SRAM structure;
- a third power node contact through the dielectric layer to the SRAM structure, a length of the third power node contact being greater than a length of the complementary bit line contact, a width of the third power node contact being less than a width of the complementary bit line contact; and
- a fourth power node contact through the dielectric layer to the SRAM structure, the length of the complementary bit line contact, the length of the third power node contact, and a length of the fourth power node contact being aligned along a second boundary of the SRAM cell, a width of the fourth power node contact being equal to the width of the third power node contact.

12. The structure of claim 11, wherein a width of the complementary bit line contact is equal to a width of the bit line contact.

13. The structure of claim 8, wherein a first longitudinal end of the first power node contact is aligned over a first source/drain region.

14. The structure of claim 13, wherein the first power node contact extends laterally past the first source/drain region.

15. The structure of claim 14, wherein the dielectric layer extends between a bottom surface of the first power node contact and the substrate.

16. A structure comprising:
- a substrate;
- a static random access memory (SRAM) structure on the substrate;
- a dielectric layer over the SRAM structure on the substrate;
- a bit line contact extending through the dielectric layer to the SRAM structure;
- a first power node contact through the dielectric layer to the SRAM structure; and
- a second power node contact extending through the dielectric layer to the SRAM structure, a longitudinal axis of the first power node contact being aligned with a longitudinal axis of the second power node contact and a longitudinal axis of the bit line contact, a width of the first power node contact and a width of the second power node contact being less than a width of the bit line contact.

17. The structure of claim 16, wherein the bit line contact is shared by two SRAM memory cells.

18. The structure of claim 16, wherein the dielectric layer extends along bottom surfaces of the bit line contact, the first power node contact, and the second power node contact.

19. The structure of claim 16, wherein the width of the bit line contact is at least 0.5 nm greater than the width of the first power node contact.

20. The structure of claim 16, wherein the bit line contact electrically contacts a source/drain region, wherein the bit line contact extends laterally past opposing sides of the source/drain region.

* * * * *